US009214760B2

(12) United States Patent
Endo et al.

(10) Patent No.: US 9,214,760 B2
(45) Date of Patent: Dec. 15, 2015

(54) CONNECTOR TERMINAL INCLUDING BUFFER PORTION AND CONNECTOR HOUSING USED FOR THE SAME

(71) Applicant: DAI-ICHI SEIKO CO., LTD., Kyoto (JP)

(72) Inventors: Takayoshi Endo, Shizuoka (JP); Sakai Yagi, Shizuoka (JP); Takuya Takeda, Shizuoka (JP)

(73) Assignee: DAI-ICHI SEIKO CO., LTD., Kyoto (JP)

( * ) Notice: Subject to any disclaimer, the term of this patent is extended or adjusted under 35 U.S.C. 154(b) by 0 days.

(21) Appl. No.: 14/320,967

(22) Filed: Jul. 1, 2014

(65) Prior Publication Data

US 2015/0011114 A1 Jan. 8, 2015

(30) Foreign Application Priority Data

Jul. 5, 2013 (JP) ................................ 2013-142065

(51) Int. Cl.

| | |
|---|---|
| ***H01R 12/00*** | (2006.01) |
| ***H05K 1/00*** | (2006.01) |
| ***H01R 13/58*** | (2006.01) |
| ***H01R 12/52*** | (2011.01) |
| ***H01R 12/58*** | (2011.01) |
| ***H01R 12/91*** | (2011.01) |
| ***H01R 13/422*** | (2006.01) |
| *H01R 12/70* | (2011.01) |

(52) U.S. Cl.
CPC .............. *H01R 13/58* (2013.01); *H01R 12/523* (2013.01); *H01R 12/585* (2013.01); *H01R 12/91* (2013.01); *H01R 13/4226* (2013.01); *H01R 12/7023* (2013.01)

(58) Field of Classification Search
CPC .. H01R 13/58; H01R 13/4226; H01R 12/523; H01R 12/91; H01R 12/585; H01R 21/7023
USPC ............ 439/75, 449, 66, 81, 751, 752, 752.5, 439/82
See application file for complete search history.

(56) References Cited

U.S. PATENT DOCUMENTS 4,889,500 A 12/1989 Lazar et al.
6,206,735 B1 * 3/2001 Zanolli ........................ 439/736
6,561,817 B1 5/2003 Ma (Continued)

FOREIGN PATENT DOCUMENTS

EP 2 685 566 1/2014
JP 2-66860 3/1990

(Continued)

OTHER PUBLICATIONS

Machine translation of JP 2567792, May 18, 2015.*

(Continued)

*Primary Examiner* — Javaid Nasri
(74) *Attorney, Agent, or Firm* — Wenderoth, Lind & Ponack, L.L.P.

(57) ABSTRACT

The connector terminal includes at opposite ends a pair of press-fit terminals to be inserted into through-holes formed through two printed circuit boards located facing each other, each of the press-fit terminals having a plurality of contact pieces, and further includes at least one buffer portion deformable in accordance with a gap between imaginary longitudinal center lines of the press-fit terminals.

16 Claims, 29 Drawing Sheets

(56) References Cited

U.S. PATENT DOCUMENTS

| | | | |
|---|---|---|---|
| 2011/0051389 | A1 | 3/2011 | Goto |
| 2012/0156898 | A1 | 6/2012 | Kallee |
| 2014/0017914 | A1 | 1/2014 | Endo et al. |

FOREIGN PATENT DOCUMENTS

| | | |
|---|---|---|
| JP | 4-29196 | 5/1992 |
| JP | 7-230862 | 8/1995 |
| JP | 2567792 | 10/1996 |
| JP | 2003-217770 | 7/2003 |
| JP | 4585017 | 9/2010 |

OTHER PUBLICATIONS

European Search Report (ESR) issued Sep. 23, 2014 in corresponding European Patent Application No. EP 14 17 3504.

* cited by examiner

CONNECTOR TERMINAL INCLUDING BUFFER PORTION AND CONNECTOR HOUSING USED FOR THE SAME

BACKGROUND OF THE INVENTION

1. Field of the Invention

The present invention relates to a connector terminal including at opposite ends thereof a pair of press-fit terminals to be inserted into through-holes formed through each of two printed circuit boards located facing each other, to thereby electrically connect the two printed circuit boards to each other. The present invention relates further to a connector housing suitable to the connector terminal.

2. Description of the Related Art

There is known an electric connector holding a plurality of connector terminals in a line. The connector terminals are inserted at one of ends thereof into through-holes formed through a first printed circuit board, and at the other end thereof into through-holes formed through a second printed circuit board, to thereby electrically connect circuits mounted on the first and second printed circuit boards to each other.

FIGS. 27A and 27B illustrate a connector 100 suggested in Japanese Patent Publication No. H4 (1982)-29196.

The illustrated connector 100 includes a housing 110, and a plurality of post contacts 120. The connector 100 electrically connects printed circuit boards 101 and 102 (see FIG. 27B) to each other. The housing 110 includes a pair of side pillars 112 each including a latch arm 111 at a lower end thereof, and an upper bar 113 and a lower bar 114 both horizontally connecting the side pillars 112 to each other. Each of the post contacts 120 is bent at a lower end thereof by about 90 degrees into an L-shape, and soldered onto the printed circuit board 102. Each of the post contacts 120 is fit at the other end thereof into a receptacle assembly 103 mounted on the printed circuit board 101 to thereby electrically connect to the printed circuit board 101.

FIG. 28 illustrates a pin header 200 suggested in Japanese Patent Application Publication No. H7 (1985)-230862.

The illustrated pin header 200 includes a plurality of connector terminals 201, and a connector holder. The connector holder includes a board 202, an upper bar 203 horizontally extending along an upper end of the board 202, a lower bar 204 horizontally extending along a lower end of the board 202, and a plurality of protrusions 205 horizontally aligned at a middle of the boards 202. The connector terminals 202 are supported by the upper bar 203 and the lower bar 204. The protrusions 205 are located in gaps formed between the adjacent connector terminals 201 to thereby electrically insulate the adjacent connector terminals 201 to each other.

In an electric connector including a plurality of connector terminals through which printed circuit boards are electrically connected to each other, a positional relation between the printed circuit boards is important. For instance, when connector terminals are inserted at opposite ends thereof into through-holes formed through printed circuit boards, to thereby electrically connect the printed circuit boards to each other, if a positional relation between the printed circuit boards were displaced, the connector terminals might be able to be inserted at one of ends thereof into through-holes of one of the printed circuit boards, but could not be inserted at the other end thereof into through-holes of the other of the printed circuit boards, because axes of the connector terminals are displaced relative to axes of the through-holes. In particular, in the case that a plurality of electric connectors is employed, it is much afraid that connector terminals cannot be inserted into one of printed circuit boards. Furthermore, if connector terminals were designed to have a smaller cross-sectional area in order to allow the connector terminals to be much resiliently deformable, the connector terminals would allow a less current to pass therethrough.

In the connector 100 illustrated in FIGS. 27A and 27B, since the post contacts 120 are connected to the printed circuit board through the receptacle assembly 103, even if there were a gap between axes of the post contacts 120 and axes of through-holes of the printed circuit board 101, the receptacle assembly 103 is considered to be able to absorb the gap. However, the connector 100 has a disadvantage that the number of parts of the connector 100 unavoidably increases in order for the connector 100 to include the receptacle assembly 103 which absorbs the above-mentioned gap.

In the pin header 200 illustrated in FIG. 28, the connector terminals 201 are inserted directly into the printed circuit boards. The connector terminals 201 are fixed by the upper bar 203 and the lower bar 204, and the protrusions 205 merely separate the adjacent connector terminals 201 from each other. Accordingly, if there were a gap in a positional relation between the printed circuit boards, since positions of the connector terminals 201 and a gap between the connector terminals 201 are fixed by the upper bar 203 and the lower bar 204, even if the connector terminals 201 can be inserted into one of the printed circuit boards, the connector terminals 201 would not be able to be inserted into the other of the printed circuit boards.

SUMMARY OF THE INVENTION

In view of the above-mentioned problems in the conventional connectors, it is an object of the present invention to provide a connector terminal capable of being inserted into printed circuit boards, even if there were a gap between axes of the connector terminals and axes of through-holes formed through the printed circuit boards. It is further an object of the present invention to provide a connector housing suitable to the above-mentioned connector terminal.

In one aspect of the present invention, there is provided a connector terminal including at opposite ends a pair of press-fit terminals to be inserted into through-holes formed through two printed circuit boards located facing each other, each of the press-fit terminals including a plurality of contact pieces, the connector terminal further including at least one buffer portion deformable in accordance with a gap between imaginary longitudinal center lines of the press-fit terminals.

In the connector terminal in accordance with the present invention, even if there were a gap in a positional relation between two printed circuit boards, the buffer portion is deformed in accordance with a gap formed between longitudinal center lines of the press-fit terminals to thereby prevent an excessive stress caused by the gap from acting on the press-fit terminals. Consequently, after one of the press-fit terminals was inserted into one of printed circuit boards, the other of the press-fit terminals can be inserted into the other of printed circuit boards without problems.

It is preferable that the buffer portion includes a plurality of resilient pieces. Each of the resilient pieces is deformable in accordance with a gap between imaginary longitudinal center lines of the press-fit terminals, and allows even a much current to pass therethrough.

It is preferable that the buffer portion further includes a pair of binders each binding the resilient pieces at one of opposite ends of the resilient pieces, each of the binders bending so as to surround the resilient pieces therewith. The binders are able to bind the resilient pieces in a U-shape, a C-shape or an arcuate shape. Thus, the resilient pieces can be uniformly bent at an entirety in any direction with rigidity thereof being ensured.

It is preferable that the resilient pieces are equal in width to one another. By designing the resilient pieces to have a common width, the resilient pieces can be deformed at any position, and further, can be smoothly deformed at an entirety.

It is preferable that the resilient pieces are collected at ends thereof in the vicinity of and in parallel with the imaginary longitudinal center lines. The resilient pieces can be deformed more readily than resilient pieces arranged to be separated from one another, ensuring that the buffer portion comprising the resilient pieces can be easily deformed.

It is preferable that the buffer portion has a length equal to or greater than a width thereof.

It is preferable that the buffer portion has a width longer than a length.

It is preferable that the connector terminal further includes at least one projecting portion located between the press-fit terminals, the projecting portion projecting beyond the press-fit terminals in a width-wise direction of the connector terminal.

It is preferable that the connector terminal further includes two projecting portions located between the press-fit terminals, each of the projecting portions projecting beyond the press-fit terminals in a width-wise direction of the connector terminal, one of the projecting portions having a length greater than the same of the other of the projecting portions in a length-wise direction of the connector terminal.

It is preferable that the projecting portion is formed of a thin resilient metal plate.

It is preferable that the buffer portion is formed of a thin resilient metal plate. Even if the imaginary longitudinal center lines are displaced to each other in a thickness-wise direction of the resilient metal plate, the buffer portion can accomplish its performance by deforming the resilient metal plate.

In another aspect of the present invention, there is provided a connector housing including a pair of holders detachably holding a plurality of connector terminals in a line, each of the connector terminals defining the above-mentioned connector terminal, wherein the holders are spaced away from each other in a length-wise direction of the connector terminals, and one of the holders holds the connector terminals in a non-fixed condition, and the other holds the connector terminals in a fixed condition.

In the connector housing in accordance with the present invention, since the connector terminals are held by one of the holders in a non-fixed condition, even if there were a gap in a positional relation between printed circuit boards, the press-fit terminals can be moved towards and be inserted into through-holes of the corresponding printed circuit board.

It is preferable that each of the holders includes a pair of arms spaced away from each other and extending in parallel with each other, and a pair of wedges each formed at a leading edge of each of the arms, the connector terminal can be inserted into a space formed between the arms through an open space formed between the wedges, and each of the holders has a resilient force causing the arms to draw each other.

Inserting a connector terminal into an open space formed between the wedges, the wedges are resiliently deformed to thereby hold the connector terminal therebetween by virtue of the resilient force of the holders.

It is preferable that a distance between the arms in the one of the holders holding the connector terminal in a non-fixed condition is set to such a distance that at least one of the arms does not make contact with the connector terminal when the connector terminal is inserted between the arms, and a distance between the arms in the other of the holders holding the connector terminal in a fixed condition is set to such a distance that both of the arms make contact with the connector terminal when the connector terminal is inserted between the arms.

By designing the distances between the arms and the holders in the above-mentioned manner, a connector terminal can be held by the holders in a fixed or non-fixed condition.

It is preferable that the connector housing further includes a projection projecting towards the wedges in a space formed between the arms in each of the holders, the projection in the one of the holders holding the terminal connector in a non-fixed condition has such a length that the projection does not make contact with the connector terminal when the connector terminal is inserted between the arms, and the projection in the other of the holders holding the terminal connector in a fixed condition has such a length that the projection makes contact with the connector terminal when the connector terminal is inserted between the arms.

The projections assist the holders for holding connector terminals in a fixed or non-fixed condition.

In still another aspect of the present invention, there is provided a connector housing including a pair of holders detachably holding a plurality of connector terminals in a line, each of the connector terminals defining the above-mentioned connector terminal including the projecting portion, wherein the holders are spaced away from each other in a length-wise direction of the connector terminals, one of the holders holds the connector terminals in a non-fixed condition, and the other holds the connector terminals in a fixed condition, and the projecting portion makes abutment in each of the holders with edges extending perpendicularly to a length-wise direction of the connector terminal.

The advantages obtained by the aforementioned present invention will be described hereinbelow.

In accordance with the present invention, even if there were a gap in a positional relation between printed circuit boards, the press-fit terminals can be surely inserted into the printed circuit boards, because the gap is absorbed into the buffer portion, and thus, one of the press-fit terminals can be brought to through-holes of the corresponding printed circuit board, ensuring that the printed circuit boards can be surely connected to each other through the connector terminals with the connector terminals being allowed to have a necessary strength and allowing a much current to pass therethrough.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

First Embodiment

Figure 1:
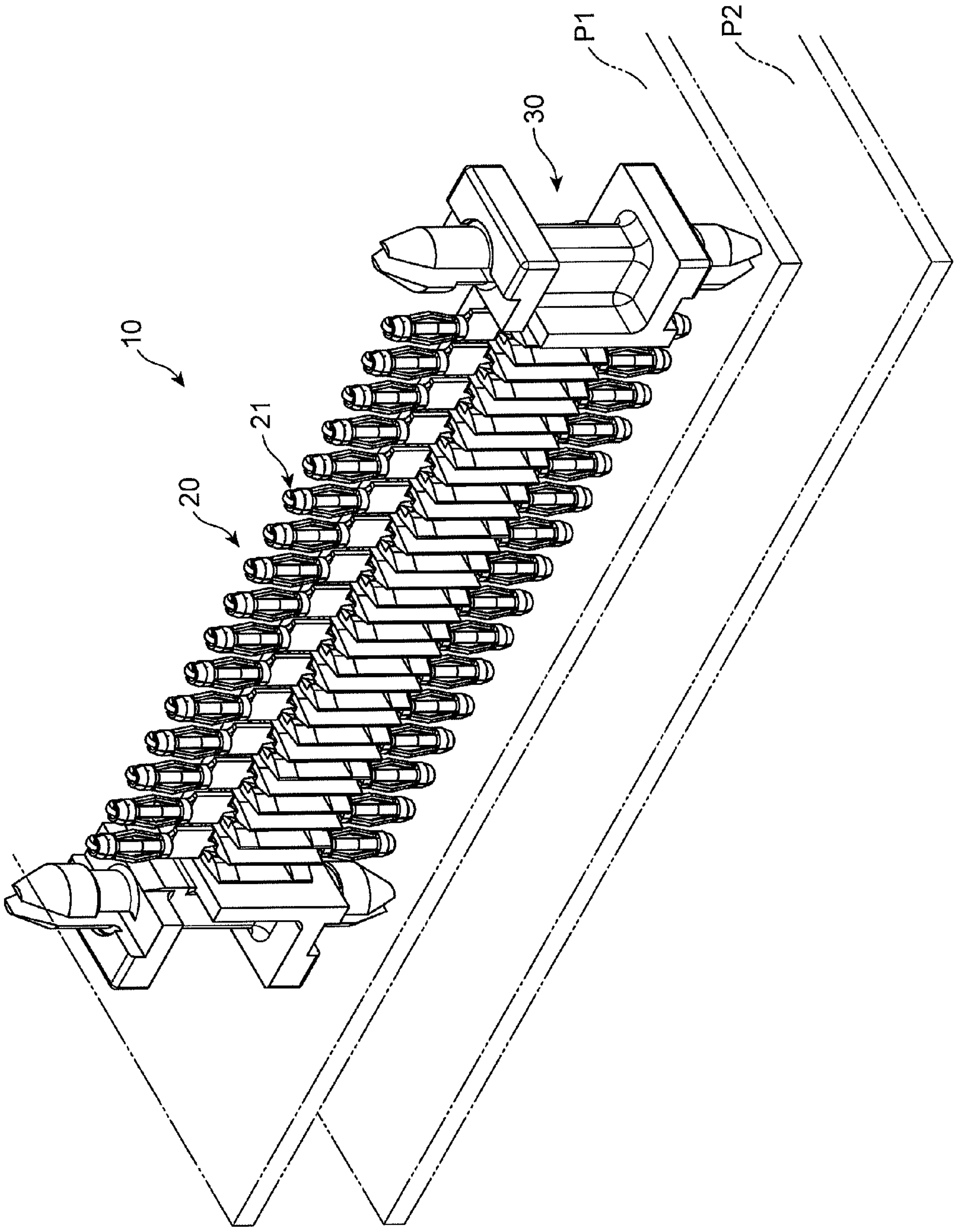
FIG. 1 is a perspective view of the connector housing in accordance with the first embodiment of the present invention through which two printed circuit boards are electrically and mechanically connected to each other.

An electric connector in accordance with the first embodiment of the present invention is explained hereinbelow with reference to the drawings.

The electric connector 10 in accordance with the first embodiment, illustrated in FIGS. 1 to 6, is equipped in a vehicle for electrically connecting two printed circuit boards P1 and P2 (see FIG. 2) facing each other.

The electric connector 10 includes a plurality of connector terminals 20 each in the form of a bar, and a connector housing 30 supporting the connector terminals 20 in a line.

Each of the connector terminals 20 illustrated in FIGS. 10 to 13 includes first and second press-fit terminals 21*a* and 21*b* at opposite ends, first and second projecting portions 22*a* and 22*b* restricting the connector terminal 20 in the movement in a length-wise direction of the connector terminal 20, and a buffer portion 23 deformable in accordance with a gap between imaginary longitudinal center lines L of the press-fit terminals 21. The connector terminal 20 is inserted through the press-fit terminals 20 into through-holes formed through printed circuit boards P1 and P2 (see FIG. 2).

Figure 14:
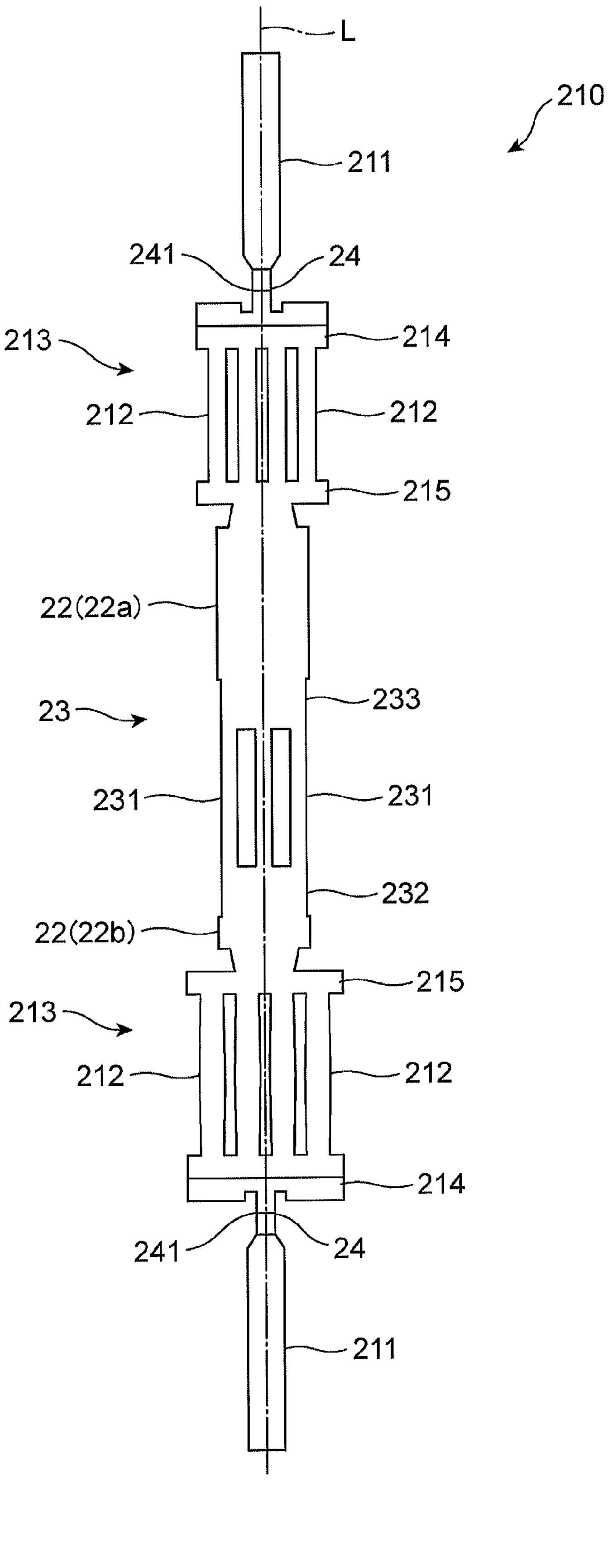
FIG. 14 is a plan view of the development of the connector terminal illustrated in FIG. 10.

The connector terminal 20 can be manufactured by bending a single metal plate 210 having resiliency, illustrated in FIG. 14.

Figure 10:
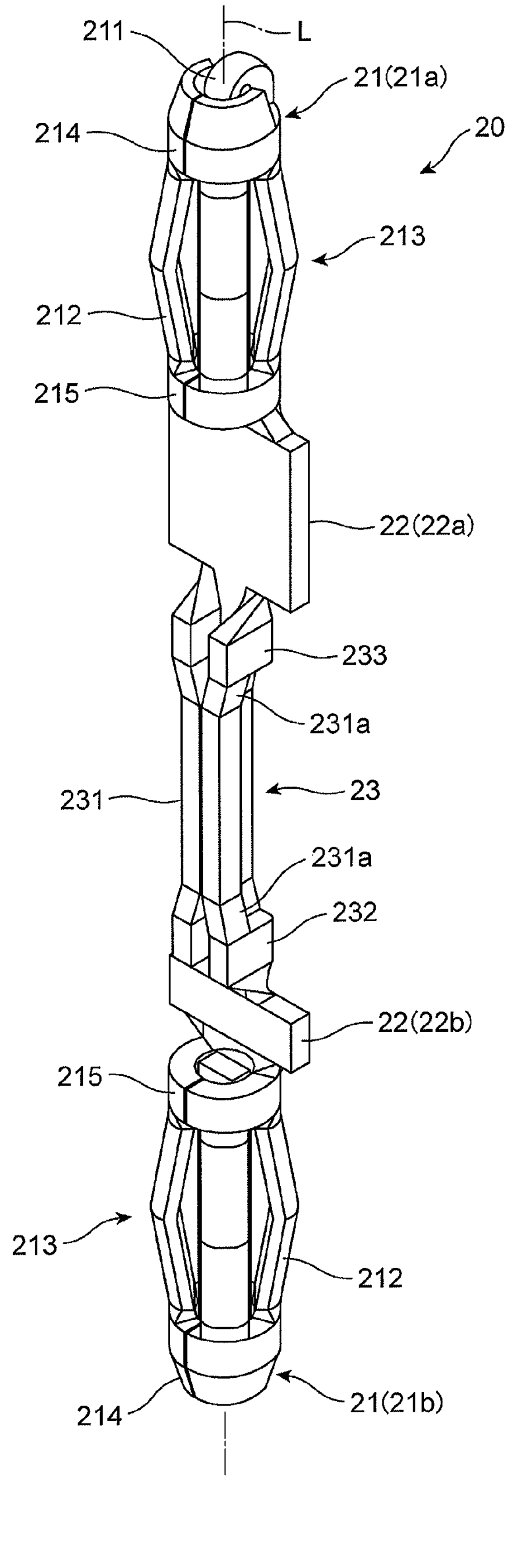
FIG. 10 is a perspective view of the connector terminal to be supported in the electric connector in accordance with the first embodiment of the present invention.

Each of the first and second press-fit terminals 21*a* and 21*b* can be connected to the printed circuit boards P1 and P2 without being soldered. As illustrated in FIG. 10, each of the first and second press-fit terminals 21*a* and 21*b* includes a shaft portion 211 having a U-shaped cross-section, a contact portion 213 having a plurality of arcuate contact pieces 212, and binders 214 and 215. The contact pieces 212 are equally spaced away from one another and arranged to surround the shaft portion 211 such that they extend in a length-wise direction of the shaft portion 211, and outwardly project. That is, the contact portion 213 is in the form of a barrel around the shaft portion 211. Furthermore, the contact portion 213 is able to resiliently increase and decrease a diameter thereof, because the contact pieces 212 are resiliently deformable. Each of the binder 214 is C-shaped to thereby surround the shaft portion 211 at outer ends of the contact pieces 212, and each of the binders 15 is C-shaped to thereby surround the shaft portion 11 at inner ends of the contact pieces 212.

As illustrated in FIGS. 10 to 13, each of the first and second projecting portions 22*a* and 22*b* is located adjacent to the first and second press-fit terminals 21*a* and 21*b*, respectively, and project beyond the first and second press-fit terminals 21*a* and 21*b* in a width-wise direction of the connector terminal 20. As explained later, each of the first and second projecting portions 22*a* and 22*b* makes abutment with an outer edge of later-mentioned first and second holders 32*a* and 32*b* of the connector housing 30, respectively.

The first projecting portion 22*a* located closer to the printed circuit board P1 (see FIG. 2) is longer in a length-wise direction of the connector terminal 20 than the second projecting portion 22*b* located closer to the printed circuit board P2, and is equal in length to the second projecting portion 22*b* in a width-wise direction of the connector terminal 20.

Since the first and second projecting portions 22*a* and 22*b* are formed of a resilient thin metal plate, they can accomplish the same performance as that of the buffer portion 23.

The buffer portion 23 is located at a center of the connector terminal 20 between the first and second press-fit terminals 21*a* and 21*b*. As illustrated in FIGS. 10 to 13, the buffer portion 23 includes a plurality of resilient pieces 231, and binders 232 and 233 located at opposite ends of the resilient pieces 231. The resilient pieces 231 are equal in width to one another, equally spaced away from one another, and arranged in parallel with one another. The binders 232 and 233 are bent in the form of a U-shape such that they surround the imaginary longitudinal center lines L. Since the resilient pieces 231 are bound such that the resilient pieces 231 are located at opposite ends 231*a* thereof in the vicinity of the imaginary longitudinal center lines L, the resilient pieces 231 extend along and in parallel with the imaginary longitudinal center lines L.

The buffer portion 23 including a plurality of the resilient pieces 231 is preferably designed to have a length at least twice greater than a thickness thereof in order to be readily resiliently deformable.

Figure 11:
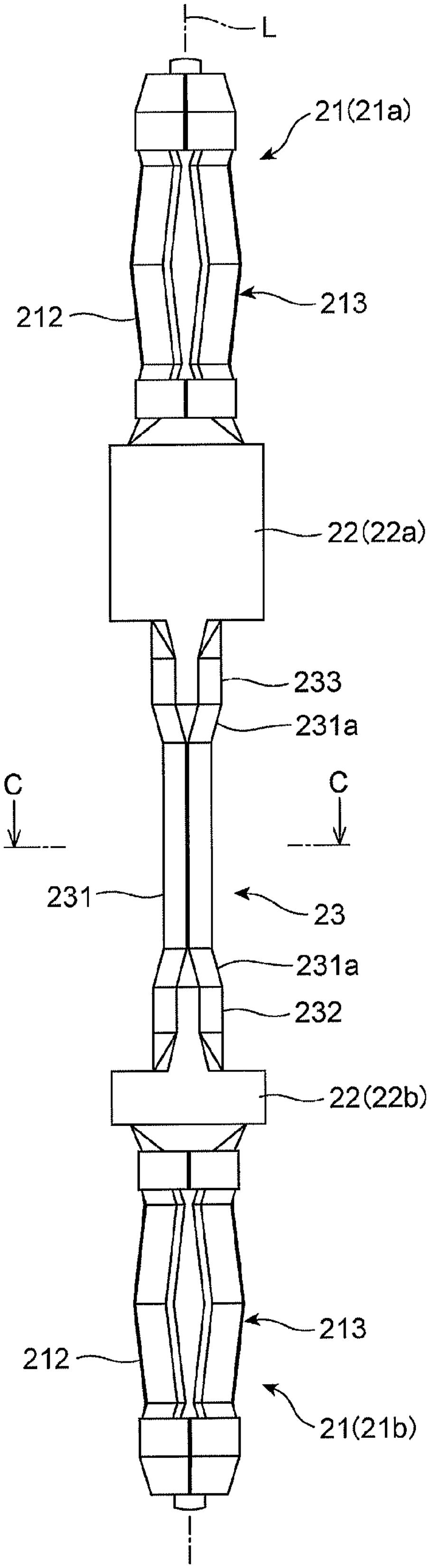
FIG. 11 is a front view of the connector terminal illustrated in FIG. 10.
Figure 12:
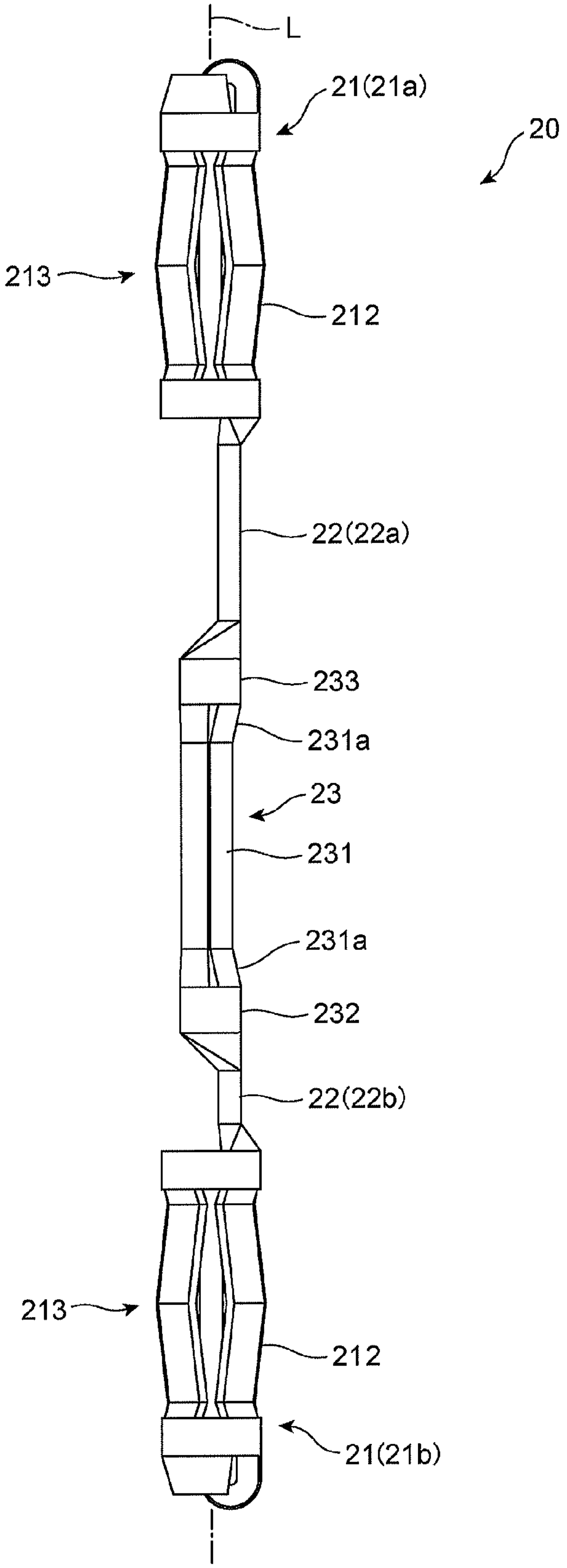
FIG. 12 is a side view of the connector terminal illustrated in FIG. 10.
Figure 13:
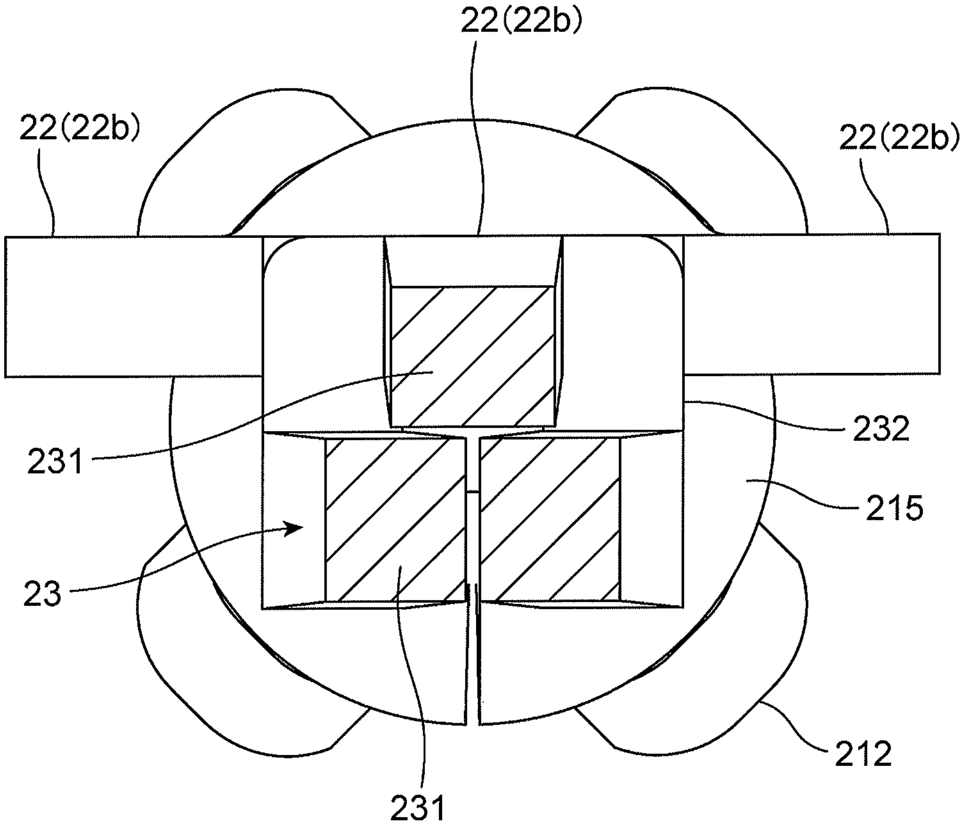
FIG. 13 is a cross-sectional view taken along the line C-C shown in FIG. 11.

As illustrated in FIG. 13, the buffer portion 23 in the first embodiment includes three resilient pieces 231 surrounded by the binders 232 and 233 bent into a U-shape. Consequently, the buffer portion 23 has a thickness equal to a total of thicknesses of the two resilient pieces 231. In the first embodiment, the resilient piece 231 has a thickness of about 0.4 mm, and accordingly, the buffer portion 23 has a thickness of about 0.8 mm. Thus, it is preferable that the buffer portion 23 has a length equal to or longer than about 1.6 mm. The buffer portion illustrated in FIG. 11 is designed to have a length about four times greater than a width thereof.

In the first embodiment, the three resilient pieces 231 are connected to the binders 232 and 233 such that the resilient pieces 231 are bound with being located close to one another. Hence, each of the three resilient pieces 231 makes contact with each of three inner walls of the U-shaped binders 232 and 233.

For instance, in the case that the buffer portion 23 includes four or five resilient pieces 231, the binders 232 and 233 may be designed to have a rectangular or pentagonal cross-section, respectively. As an alternative, the binders 232 and 233 may be designed to be C-shaped or arcuate. It is preferable in such cases that the resilient pieces 231 are bound such that they are located at the opposite ends 231*a* thereof close to the imaginary longitudinal center lines L, and extend in parallel with the imaginary longitudinal center lines L.

Hereinbelow is explained a process of manufacturing the connector terminal 20, with reference to FIG. 14.

The connector terminal 20 is manufactured by bending a single thin metal plate 210 illustrated in FIG. 14. The metal plate 210 is formed by punching a metal plate into a desired shape.

First, each of the shaft portions 211 located at the opposite ends of the metal plate 210 is bent about the imaginary longitudinal center line L so as to have a U-shaped cross-section. Then, the U-shaped shaft portion 211 is bent by 180 degrees towards the contact portion 213 about a line 241 horizontally extending between the shaft portion 211 and the contact portion 213.

Then, the binders 214 and 215 extending in a direction perpendicular to the imaginary longitudinal center line L and defining outer edges of the contact portion 213 are bent into a C-shape, and the contact pieces 212 extending in parallel with the imaginary longitudinal center line L are bent into a barrel shape such that the resultant contact portion 213 surrounds the shaft portion 211.

After a folding line is brought into the opposite ends 231*a* with central areas of the resilient pieces 231 being kept straight, the binders 232 and 233 extending in a direction perpendicular to the imaginary longitudinal center line L and defining outer edges of the buffer portion 23 are bent into a U-shape to thereby bind therewith the resilient pieces 231 extending in parallel with the imaginary longitudinal center lines L.

Thus, there is completed the connector terminal 20 illustrated in FIGS. 10 to 13.

The resilient pieces 231 in a developed condition are designed to be equal in width to one another, equally spaced away from one another, and extend in parallel with one another, as illustrated in FIG. 14, and the resilient pieces 231 are bound at the opposite ends 231*a* thereof by the bent binders 232 and 233 in the vicinity of the imaginary longitudinal center lines L, as illustrated in FIGS. 10 to 13. Thus, the resilient pieces 231 can be arranged in parallel with and in the vicinity of the imaginary longitudinal center lines L without being bent.

As illustrated in FIGS. 3 to 9, the connector housing 30 is formed by a resin injection process, and is substantially H-shaped. The connector housing 30 includes a support plate 31 horizontally extending to cover a length in which the connector terminals 20 are located in a line, first and second holders 32*a* and 32*b* for holding each of the connector terminals 20, projections 33 (see FIGS. 7 and 8) cooperating with the first and second holders 32*a* and 32*b* to hold the connector terminals in a fixed or non-fixed condition, and a pair of legs 34 for connecting the connector housing 30 to the printed circuit boards P1 and P2.

The support plate 31 extends between the legs 34, and is rectangular in shape.

The first and second holders 32*a* and 33*b* are formed on the support plate 31, and equally spaced away from one another. Each of the first and second holders 32*a* and 32*b* includes a pair of claws 321, and a pair of guide walls 322 (see FIG. 9) between which the buffer portion 23 is located when the connector terminal 20 is held by the first and second holders 32*a* and 32*b*.

Each of the claws 321 includes a pair of arms 321*a* extending from the support plate 31, and being resiliently deformable when the connector terminal 20 is inserted thereinto, and a pair of wedges 321*b* formed at a distal end of each of the arms 321*a*, and being tapered such that a distance therebetween is greater at a location remoter from the support plate 31. Between the arms 321*a* is formed a rectangular space R in which the connector terminal 20 is housed.

Figure 2:
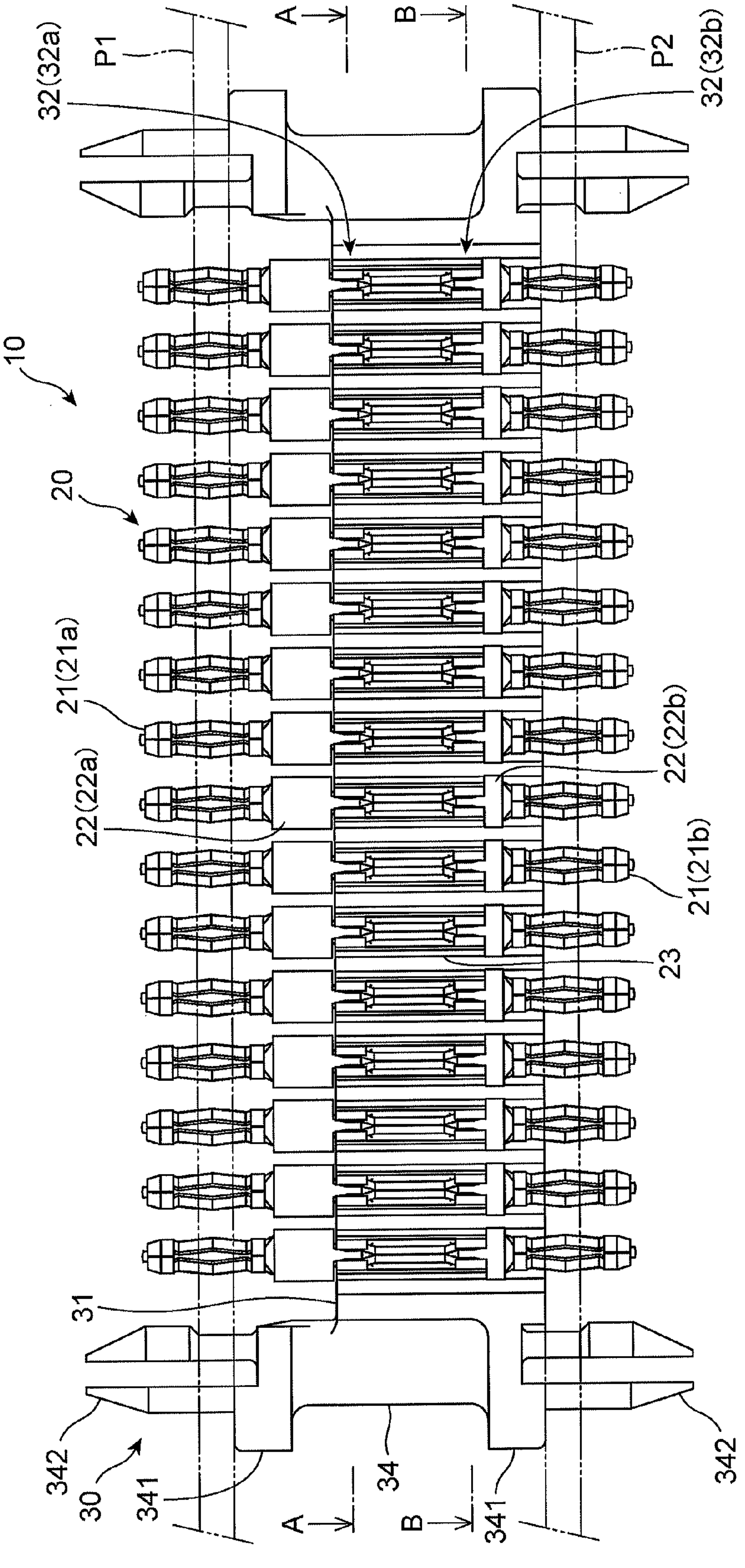
FIG. 2 is a front view of the electric connector in accordance with the first embodiment of the present invention.
Figure 3:
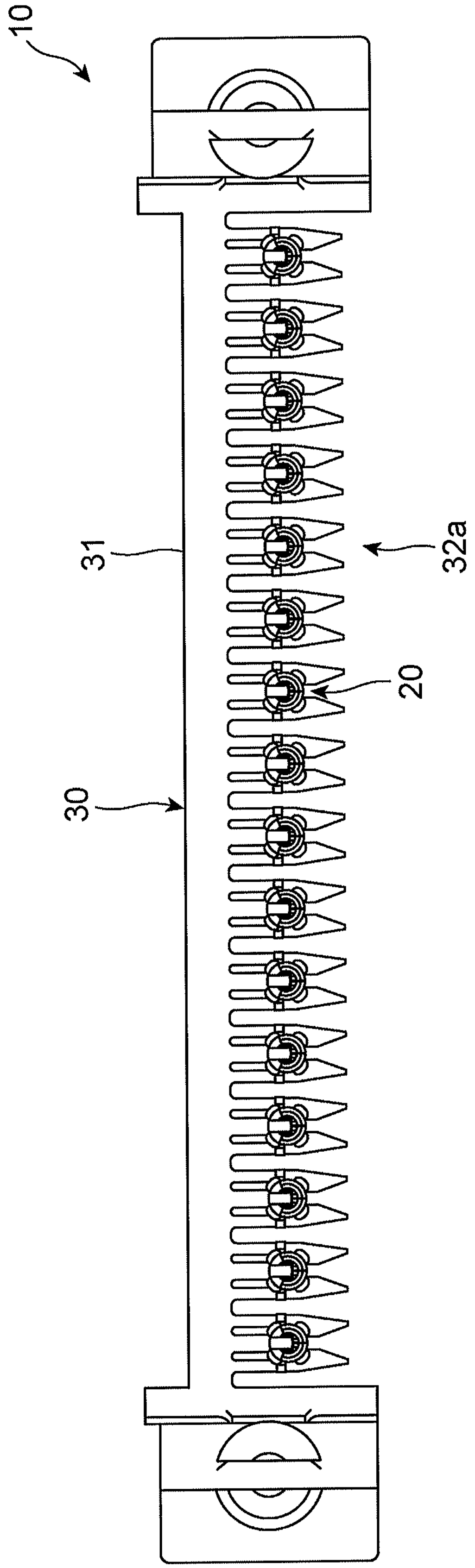
FIG. 3 is a plan view of the electric connector in accordance with the first embodiment of the present invention.
Figure 4:
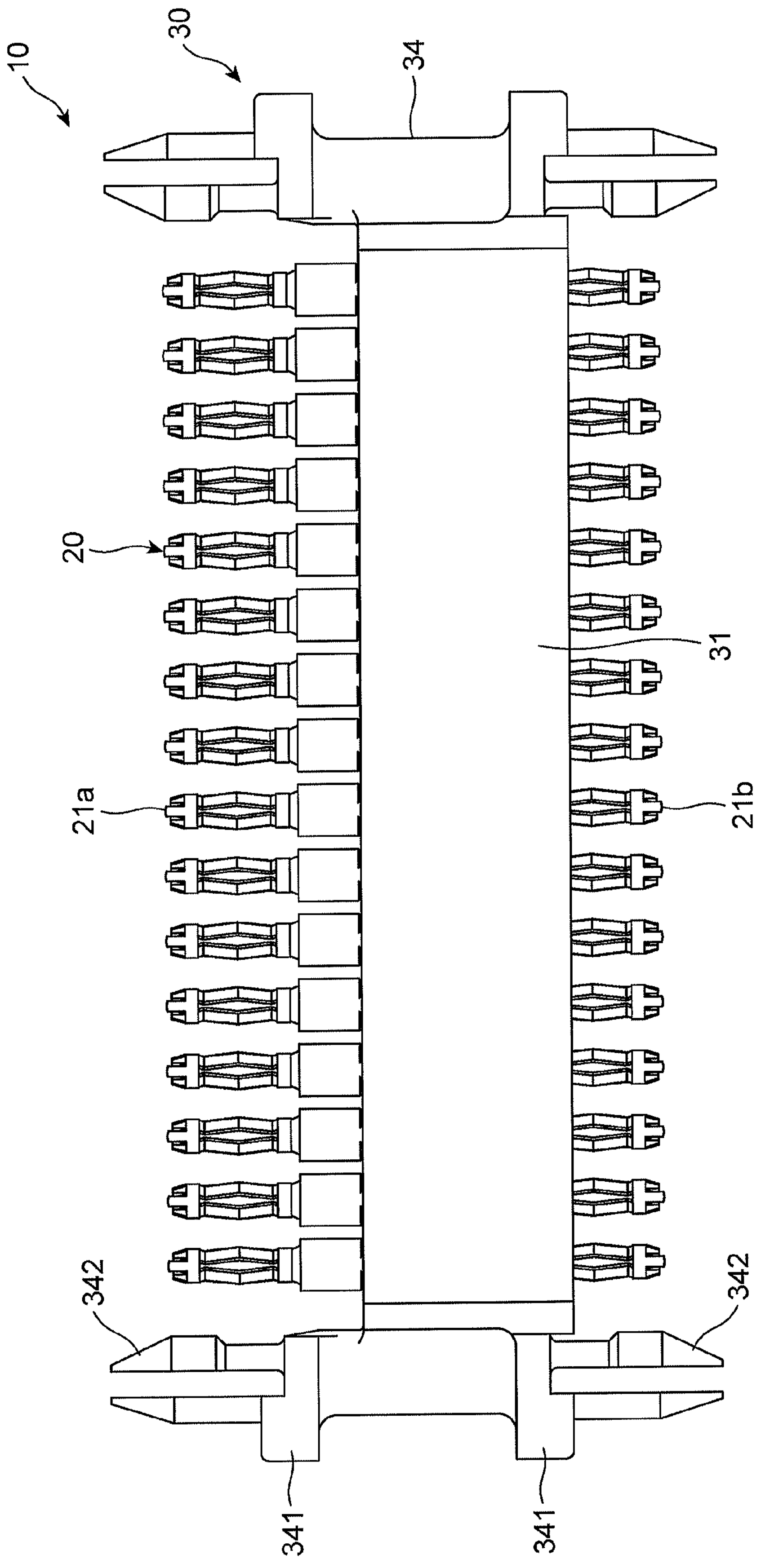
FIG. 4 is a rear view of the electric connector in accordance with the first embodiment of the present invention.
Figure 5:
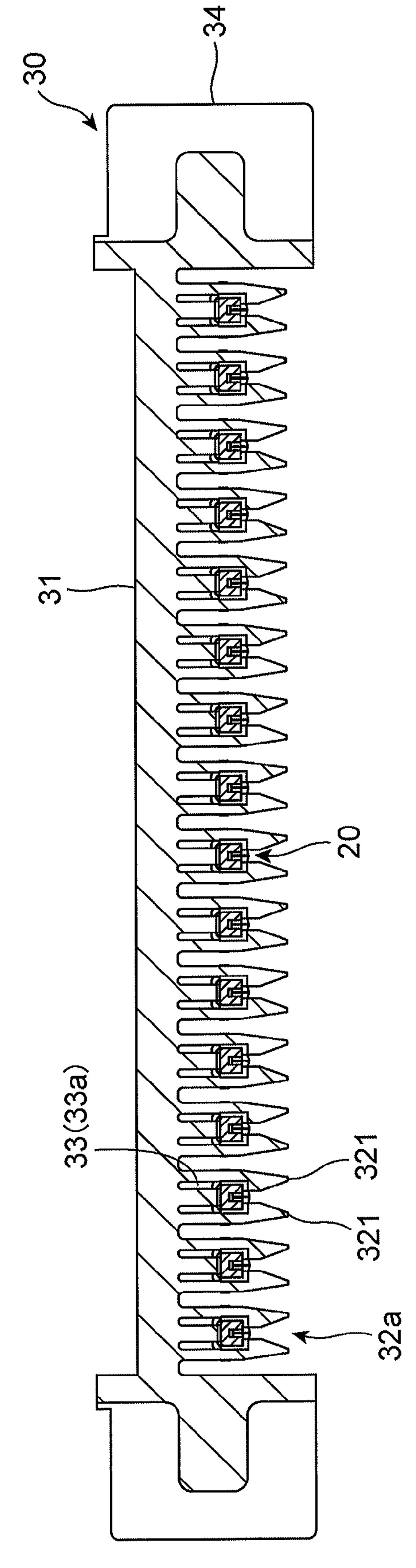
FIG. 5 is a cross-sectional view taken along the line A-A shown in FIG. 2.
Figure 6:
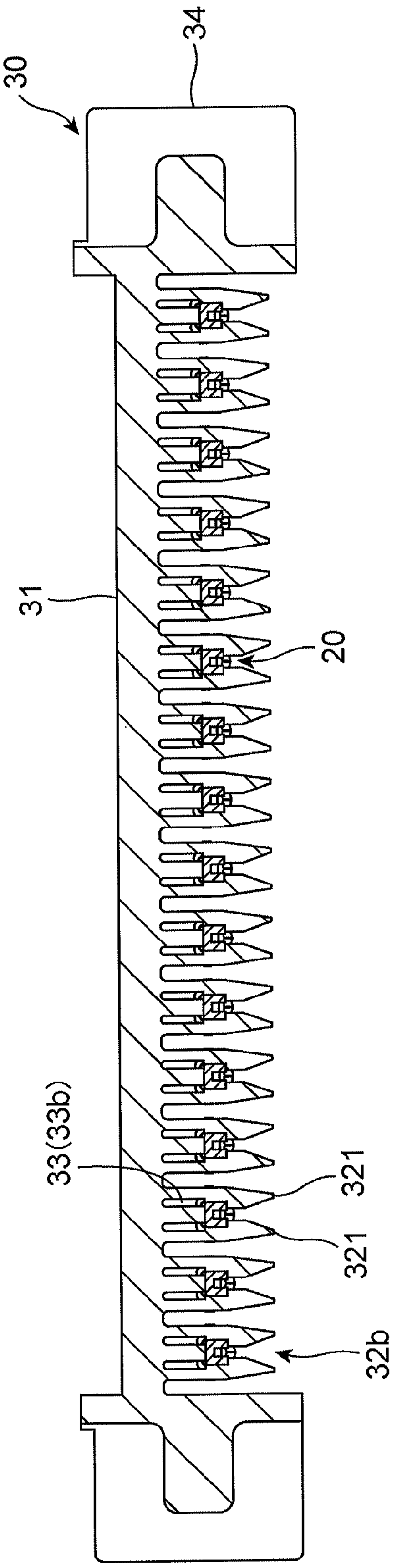
FIG. 6 is a cross-sectional view taken along the line B-B shown in FIG. 2.

As illustrated in FIG. 2, the first holder 32*a* is located at an upper area of the support plate 31, that is, located closer to the printed circuit board P1, and the second holder 32*b* is located at a lower area of the support plate 31, that is, located closer to the printed circuit board P2.

Figure 7:
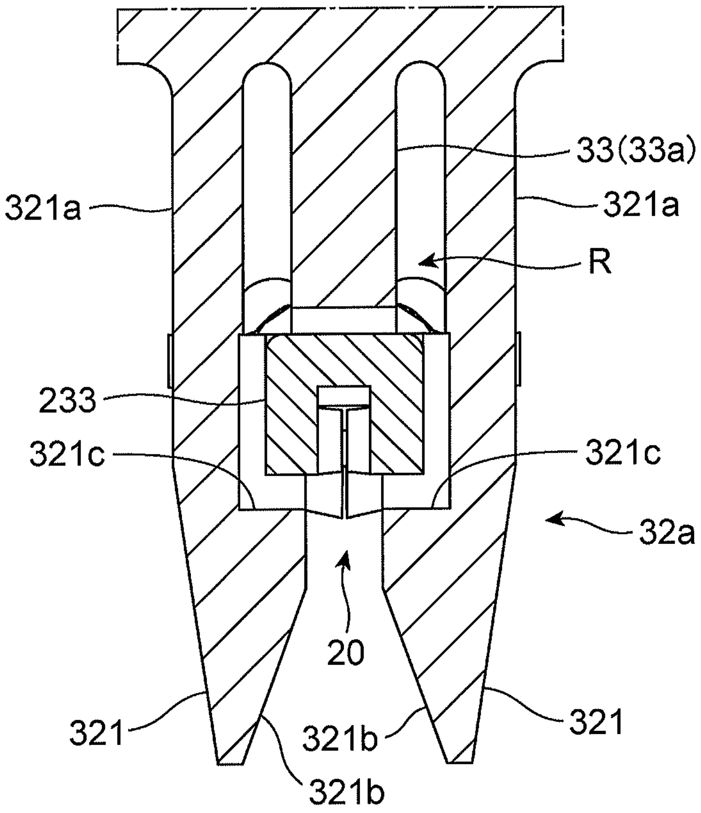
FIG. 7 is an enlarged plan view of the first holder in the electric connector in accordance with the first embodiment of the present invention.

As illustrated in FIG. 7, a distance between the arms 321*a* in the first holder 32*a* is set to such a distance that the arms 321*a* do not make contact with the connector terminal 20 when the connector terminal 20 is inserted into the space R.

Figure 8:
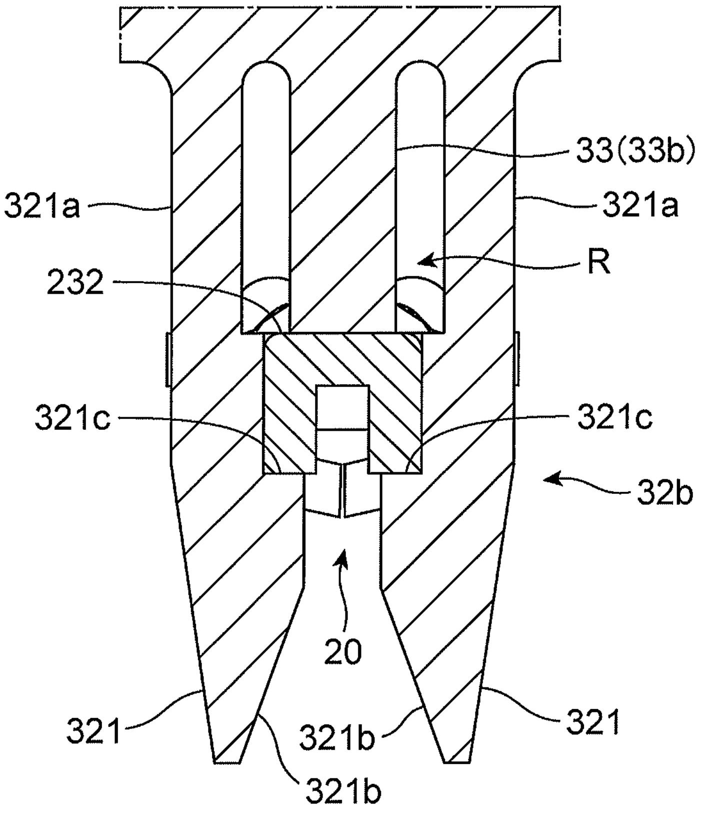
FIG. 8 is an enlarged plan view of the second holder in the electric connector in accordance with the first embodiment of the present invention.
Figure 9:
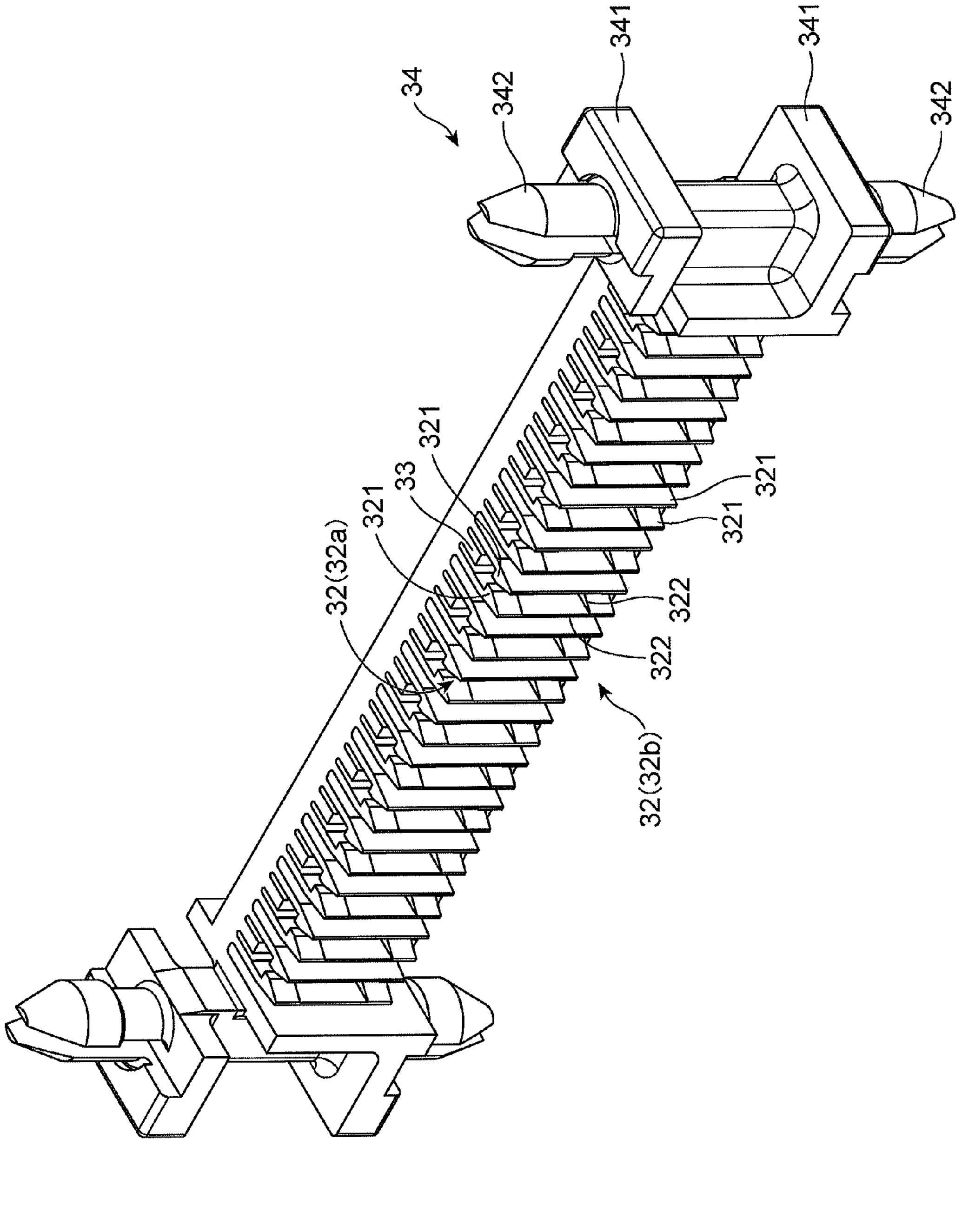
FIG. 9 is a perspective view of the connector housing of the electric connector in accordance with the first embodiment of the present invention.

In contrast, as illustrated in FIG. 8, a distance between the arms 321*a* in the second holder 32*b* is set to such a distance that the arms 321*a* make contact with the connector terminal 20 when the connector terminal 20 is inserted into the space R. Specifically, each of the arms 321*a* of the second holder 32*b* is designed to have a raised portion at which the arm 321*a* makes contact with the inserted connector terminal 20.

Each of the projections 33 projects in the space R from the support plate 31 towards the wedges 321*b* between the arms 321*a*.

As illustrated in FIG. 7, the projection 33*a* in the first holder 32*a* is designed to have such a length that the projection 33*a* does not make contact with the connector terminal 20 when the connector terminal 20 is inserted between the arms 321*a*. Specifically, the projection 33*a* has such a length that even when the binder 233 of the buffer portion 23 is inserted into the space R, there is formed a gap between the inserted connector terminal 20 and an inner walls 321*c* of the wedges 321*b* and/or between the inserted connector terminal 20 and the projection 33*a*. Thus, the claws 321 and the projection 33*a* hold the inserted connector terminal 20 in a non-fixed condition.

As illustrated in FIG. 8, the projection 33*b* in the second holder 32*b* is designed to be longer than the projection 33*a* in the first holder 32*a*. Specifically, the projection 33*b* in the second holder 32*b* is designed to have such a length that the projection 33*b* makes contact with the connector terminal 20 when the connector terminal 20 is inserted between the arms 321*a*. Specifically, the projection 33*b* has such a length that when the binder 232 of the buffer portion 23 is inserted into the space R, the inserted connector terminal 20 is sandwiched between the inner walls 321*c* of the wedges 321*b* and the projection 33*b*. Thus, the claws 321 and the projection 33*b* hold the inserted connector terminal 20 in a fixed condition.

The legs 34 are formed at opposite ends of the support plate 31. Being inserted into through-holes (not illustrated) formed through the printed circuit boards P1 and P2, the legs 34 fix the connector housing 30 between the printed circuit boards P1 and P2, keeping a space uniform between the printed circuit boards P1 and P2, and prevent the connector terminals 20 from being longitudinally damaged.

As illustrated in FIG. 2, each of the legs 34 includes a first portion 341, and a second portion 342 outwardly extending from the first portion 341 in a direction of the imaginary longitudinal center lines L. The first portion 341 makes contact at an outer surface thereof with the printed circuit board P1 or P2 to thereby keep a uniform space between the printed circuit boards P1 and P2. The second portion 342 is inserted into through-holes formed through the printed circuit boards P1 and P2. The second portion 342 comprises a pair of pillars having a semicircular cross-section and facing each other to thereby define a cylindrical shape. The second portion 342 includes at a distal end thereof a wedge to be engaged with an edge of an opening of the through-holes of the printed circuit boards P1 and P2 when inserted into the through-holes.

The electric connector 10 in accordance with the first embodiment, having the above-mentioned structure, is used as follows.

First, as illustrated in FIG. 2, the second portions 342 (lower ones in FIG. 2) are inserted into guide through-holes formed through the printed circuit board P2, and simultaneously, the second press-fit terminals 21*b* are inserted into through-holes formed in line through the printed circuit board P2.

Even if a stress acts on the connector terminals 20 in a direction of the imaginary longitudinal center lines L when the second press-fit terminals 21*b* are inserted into the through-holes of the printed circuit board P2, since the second projecting portion 22*b* engages with the claws 321, the connector terminals 20 are restricted from moving in a direction of the imaginary longitudinal center lines L. Consequently, the connector terminals 20 cannot move in a direction of the imaginary longitudinal center lines L, and thus, the second press-fit terminals 21*b* can be surely inserted into the through-holes of the printed circuit board P2.

Then, locating the printed circuit board P1 above the electric connector 10, the second portions 342 (upper ones in FIG. 2) are inserted into guide through-holes formed through the printed circuit board P1, and simultaneously, the first press-fit terminals 21*a* are inserted into through-holes formed in line through the printed circuit board P1.

As illustrated in FIGS. 10 and 13, since the contact pieces 212 surround the shaft portion 211, and the shaft portion 211 acts as a core to thereby reinforce the first and second press-fit terminals 21*a* and 21*b*, the first and second press-fit terminals 21*a* and 21*b* can be inserted into the printed circuit boards P1 and P2 without the first and second press-fit terminals 21*a* and 21*b* being bent. Furthermore, since the reaction force of the resiliently deformed contact pieces 212 enables the first and second press-fit terminals 21*a* and 21*b* to make close contact with inner walls of the through-holes of the printed circuit boards P1 and P2 without being soldered, ensuring stable connection between the first and second press-fit terminals 21*a* and 21*b* and the printed circuit boards P1 and P2.

Even if a positional relation between the printed circuit boards P1 and P2 were not in accuracy, that is, even if the through-holes of the printed circuit board P1 do not align with the through-holes of the printed circuit board P2, since the connector terminals 20 are held in a non-fixed condition in the spaces R of the first holders 32*a*, as illustrated in FIG. 7, the first press-fit terminals 21*a* can be shifted towards the through-holes of the printed circuit board P1. Thus, the first press-fit terminals 21*a* can be inserted into the through-holes of the printed circuit board P1.

If the connector terminal 20 is inserted into the printed circuit boards P1 and P2 with a positional relation between the printed circuit boards P1 and P2 not being in accuracy, the imaginary longitudinal center lines L of the first and second press-fit terminals 21*a* and 21*b* are not in alignment with each other.

However, the resilient pieces 231 (see FIG. 14) defining the buffer portion 23 are deformed in accordance with a gap between the imaginary longitudinal center lines L of the first and second press-fit terminals 21*a* and 21*b*, and thus, it is possible to prevent an excessive stress from acting on the first and/or second press-fit terminals 21*a* and 21*b*. Since the buffer portion 23 is formed by a plurality of the resilient pieces 231, the buffer portion 23 can be deformed in accordance with a direction in which the gap is generated, and ensures electrical connection between the printed circuit boards P1 and P2, even if a much current is to run between the printed circuit boards P1 and P2.

Figure 15:
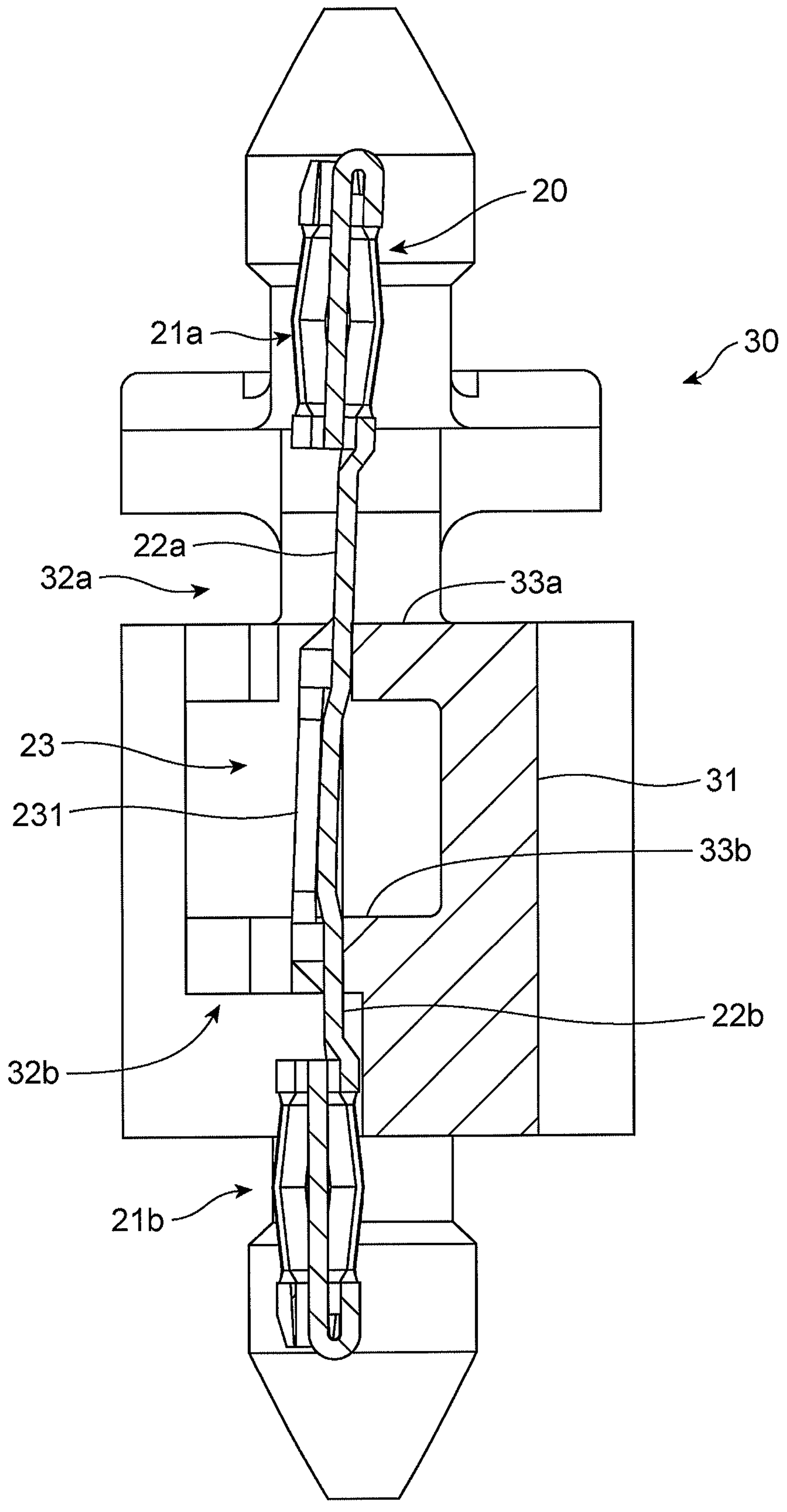
FIG. 15 is a longitudinal cross-sectional view of the connector terminal viewed in a side direction in such a condition that the imaginary longitudinal center line of one of the press-fit terminals is curved backwardly.
Figure 16:
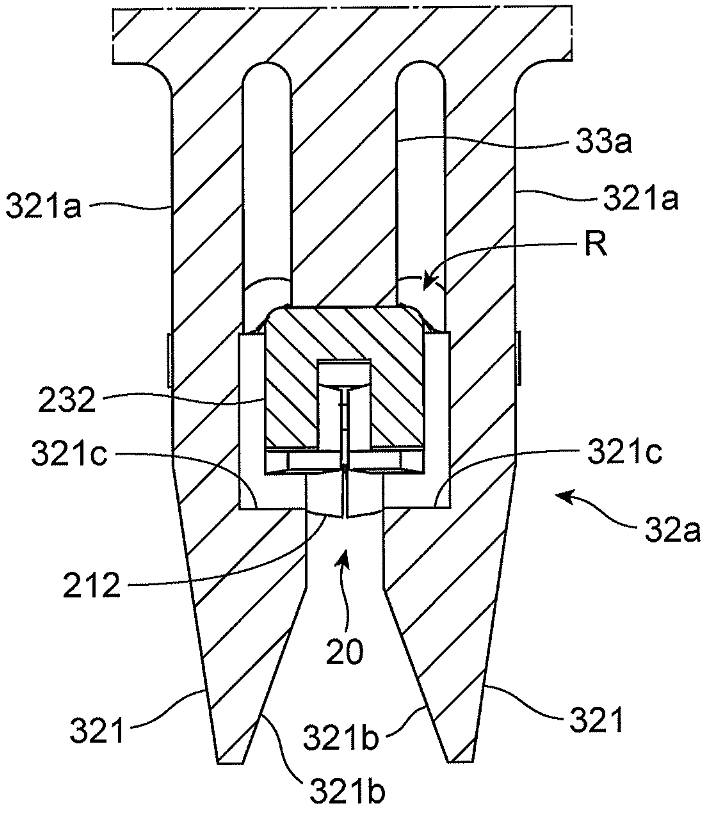
FIG. 16 is a lateral cross-sectional view of both the connector terminal and the holder in such a condition that the imaginary longitudinal center line of one of the press-fit terminals is curved backwardly.

For instance, if the through-holes of the printed circuit board P1 into which the first press-fit terminals 21*a* are inserted deviate backwardly (that is, towards the support plate 31) relative to the thorough-holes of the printed circuit board P2, as illustrated in FIGS. 15 and 16, the buffer portion 23 is deformed to such a degree that the connector terminal 20 makes abutment with the projection 33*a* in the space R of the first holder 32*a*. Thus, the connector terminal 20 can be deformed backwardly.

Figure 17:
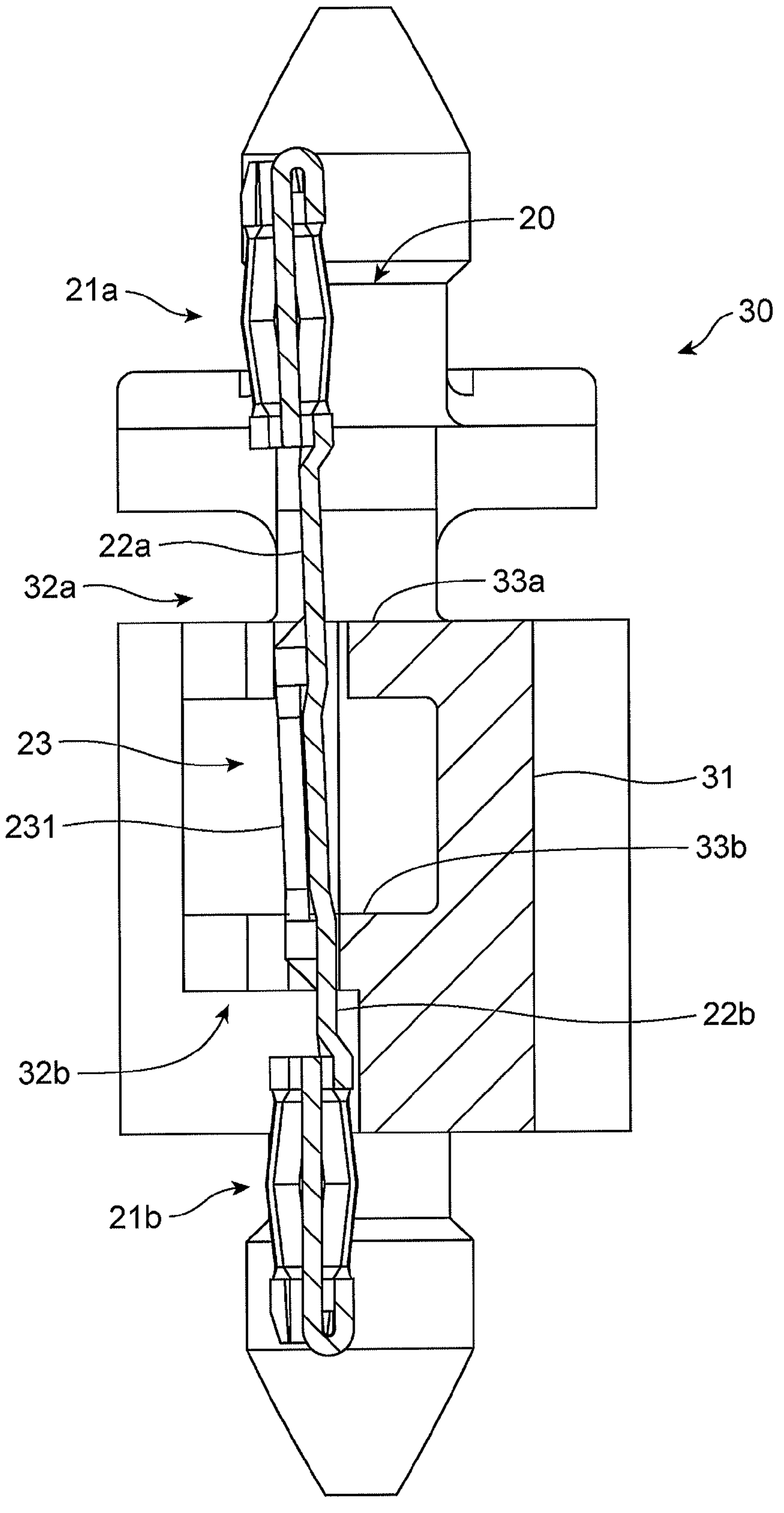
FIG. 17 is a longitudinal cross-sectional view of the connector terminal viewed in a side direction in such a condition that the imaginary longitudinal center line of one of the press-fit terminals is curved forwardly.
Figure 18:
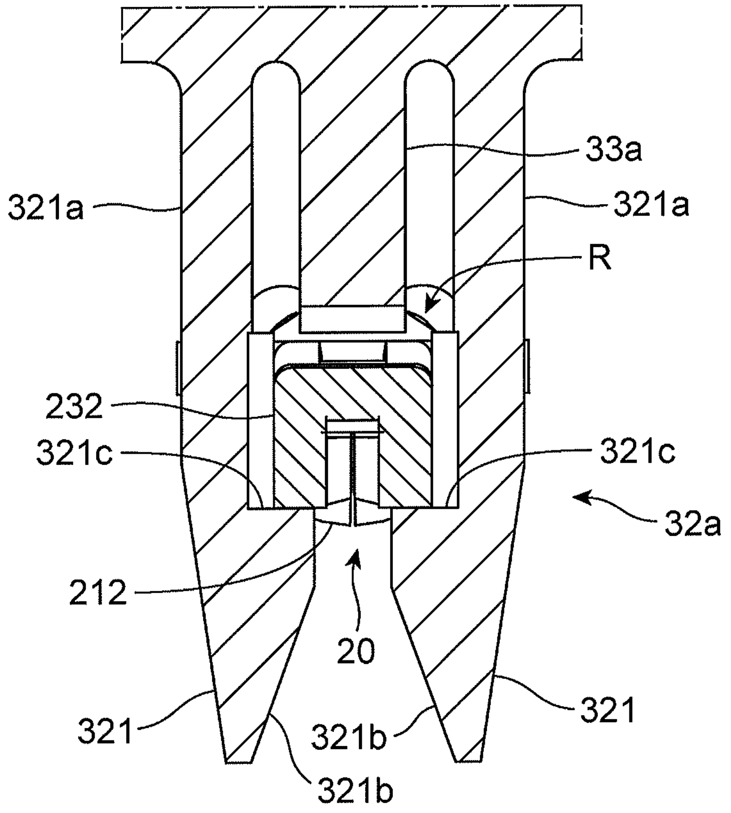
FIG. 18 is a lateral cross-sectional view of both the connector terminal and the holder in such a condition that the imaginary longitudinal center line of one of the press-fit terminals is curved forwardly.

If the through-holes of the printed circuit board P1 into which the first press-fit terminals 21*a* are inserted deviate forwardly (that is, in an opposite direction against the support plate 31) relative to the thorough-holes of the printed circuit board P2, as illustrated in FIGS. 17 and 18, the buffer portion 23 is deformed to such a degree that the connector terminal 20 makes abutment with the inner wall 321*c* of the wedges 321*b* in the space R of the first holder 32*a*. Thus, the connector terminal 20 can be deformed forwardly.

Figure 19:
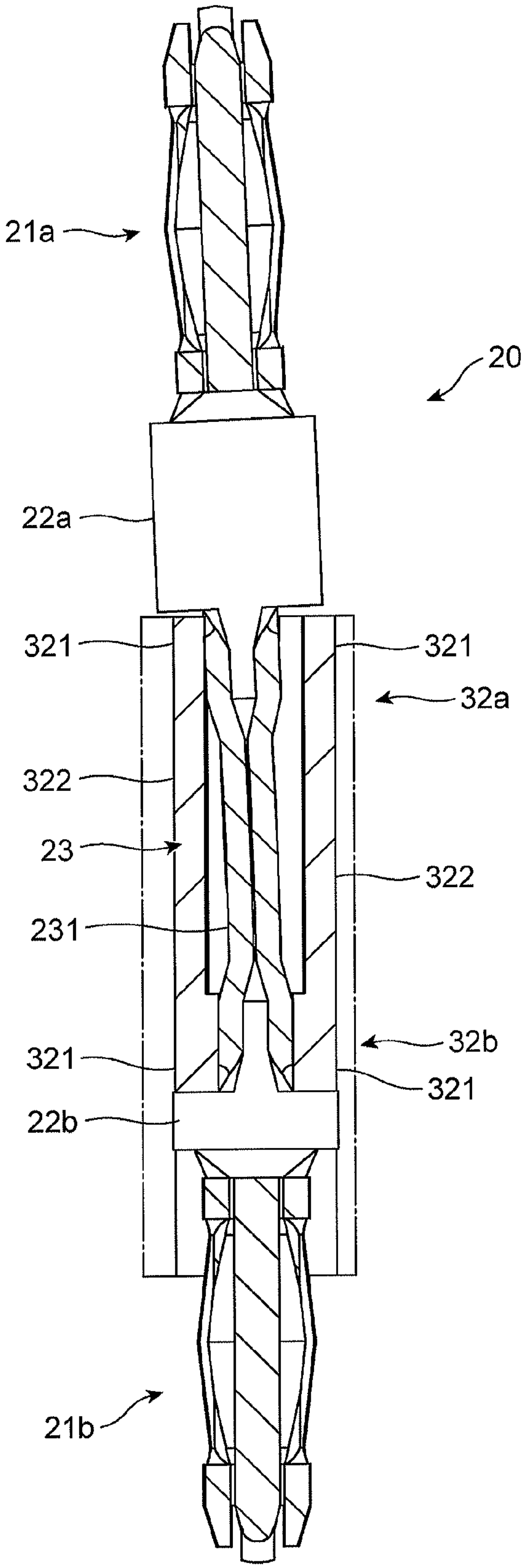
FIG. 19 is a longitudinal cross-sectional view of the connector terminal viewed in a front direction in such a condition that the imaginary longitudinal center line of one of the press-fit terminals is curved to the left.
Figure 20:
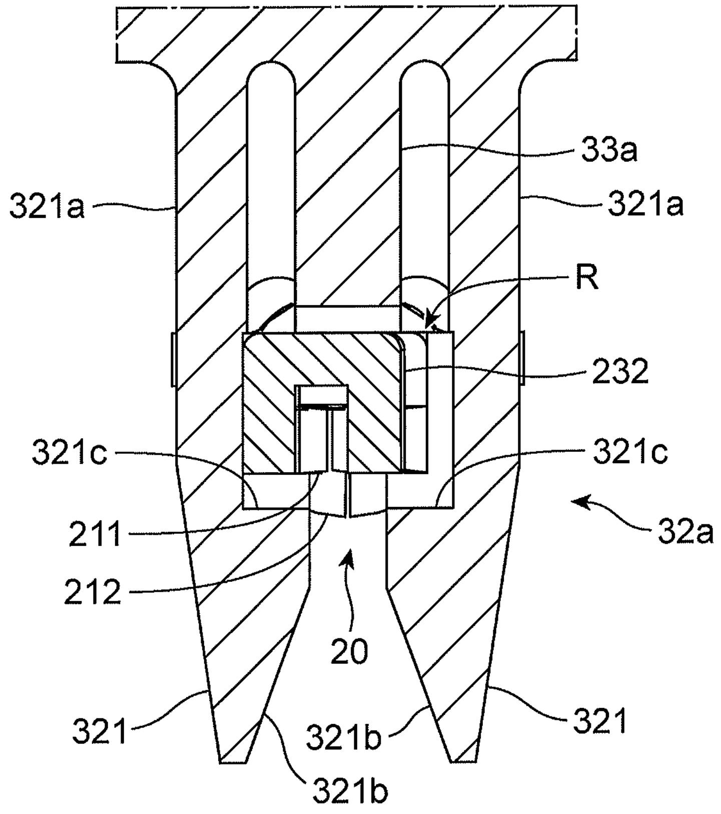
FIG. 20 is a lateral cross-sectional view of both the connector terminal and the holder in such a condition that the imaginary longitudinal center line of one of the press-fit terminals is curved to the left.

If the through-holes of the printed circuit board P1 into which the first press-fit terminals 21*a* are inserted deviate to the left relative to the thorough-holes of the printed circuit board P2, as illustrated in FIGS. 19 and 20, the buffer portion 23 is deformed to such a degree that the connector terminal 20 makes abutment with the inner wall (left-side wall in FIG. 20) of one of the arms 321*a* in the space R of the first holder 32*a*. Thus, the connector terminal 20 can be deformed to the left.

Figure 21:
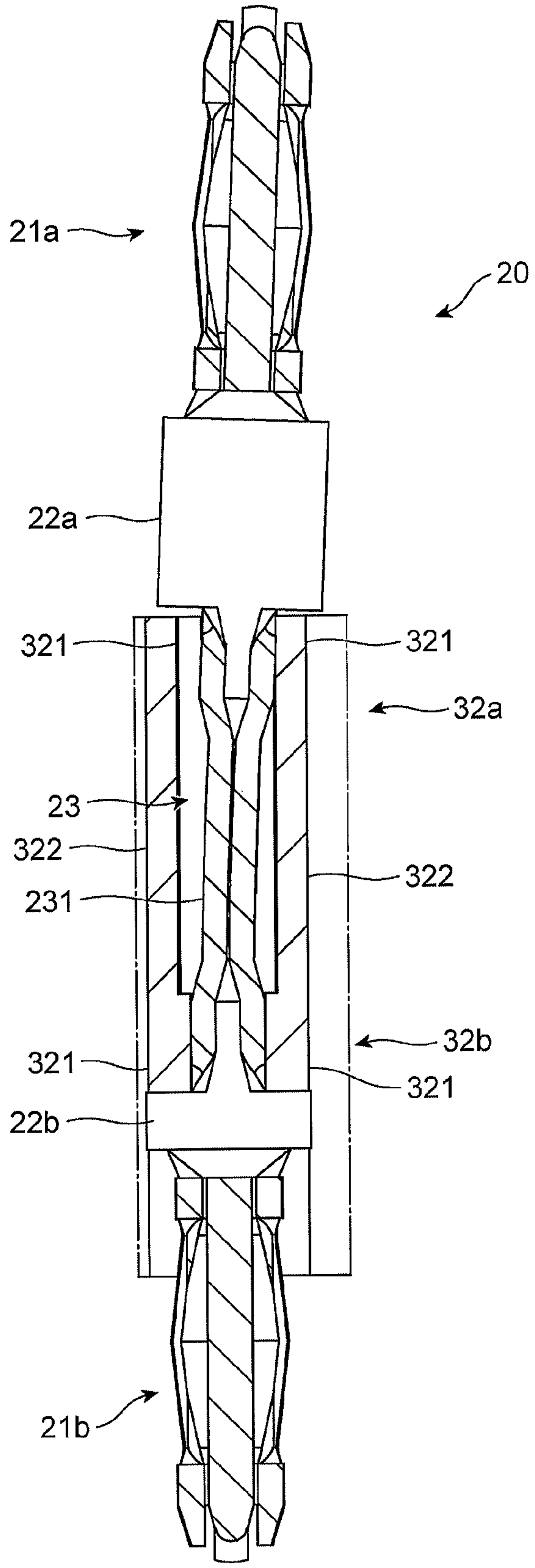
FIG. 21 is a longitudinal cross-sectional view of the connector terminal viewed in a front direction in such a condition that the imaginary longitudinal center line of one of the press-fit terminals is curved to the right.
Figure 22:
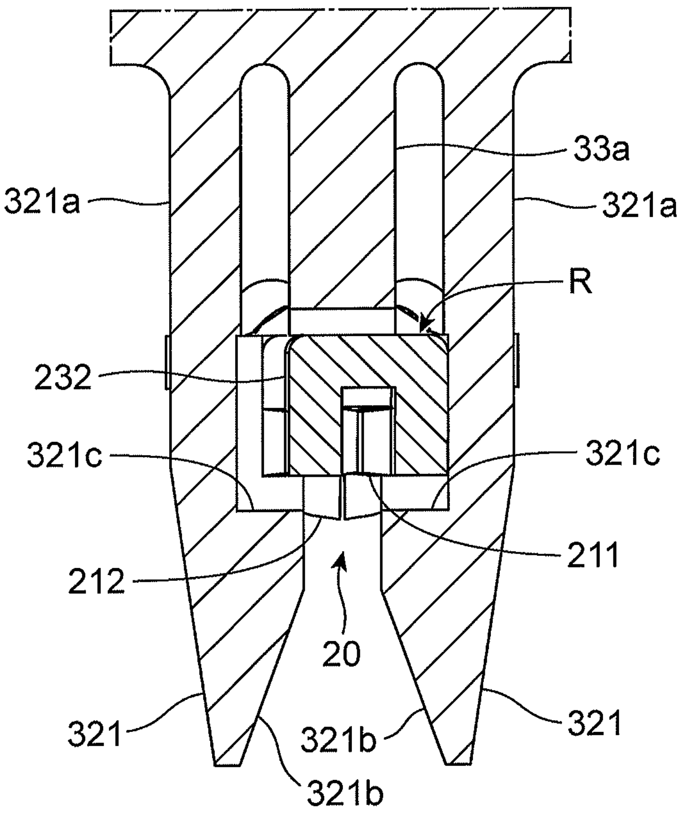
FIG. 22 is a lateral cross-sectional view of both the connector terminal and the holder in such a condition that the imaginary longitudinal center line of one of the press-fit terminals is curved to the right.

If the through-holes of the printed circuit board P1 into which the first press-fit terminals 21*a* are inserted deviate to the right relative to the thorough-holes of the printed circuit board P2, as illustrated in FIGS. 21 and 22, the buffer portion 23 is deformed to such a degree that the connector terminal 20 makes abutment with the inner wall (right-side wall in FIG. 20) of the other of the arms 321*a* in the space R of the first holder 32*a*. Thus, the connector terminal 20 can be deformed to the right.

As mentioned above, even if the through-holes of the printed circuit boards P1 and P2 deviate forwardly, backwardly or to the left or right relative to each other, the buffer portion 23 can absorb the deviation therein, and hence, the connector terminals 20 can be inserted into the printed circuit boards P1 and P2.

In particular, since the resilient pieces 231 are bound at the opposite ends 321*a* thereof in the vicinity of and in parallel with the imaginary longitudinal center lines L, the resilient pieces 23 can be readily resiliently deformed relative to the case that the resilient pieces are separated away from one another, ensuring the buffer portion 23 to be readily deformed.

Even if a stress acts on the connector terminals 20 in a direction of the imaginary longitudinal center lines L when the first press-fit terminals 21*a* are inserted into the through-holes of the printed circuit board P1, since the first projecting portion 22*a* engages with the claws 321 of the first holder 32*a*, the connector terminals 20 are restricted from moving in a direction of the imaginary longitudinal center lines L. Consequently, since the connector terminals 20 cannot move in a direction of the imaginary longitudinal center lines L even if the connector terminals 20 are held in a non-fixed condition in the spaces R of the first holders 32*a*, the first press-fit terminals 21*a* can be surely inserted into the through-holes of the printed circuit board P1.

As mentioned above, the first press-fit terminals 21*a* can be inserted into the through-holes of the printed circuit board P1 without any problems with the second press-fit terminals 21*b* being inserted into the through-holes of the printed circuit board P2.

In particular, when the through-holes formed through the printed circuit boards P1 and P2 in a plurality of lines in parallel with one another are electrically connected to each other through a plurality of the electric connectors 10, a distance between the adjacent lines and/or a distance between the adjacent through-holes may be deviated from the designed distance. A total of a deviation between the adjacent through-holes makes unignorable deviation. Even so, since the connector terminals 20 are held in a non-fixed condition in the spaces R of the first holders 32*a*, and the connector terminals 20 each includes the deformable buffer portion 23, the first and second press-fit terminals 21*a* and 21*b* can be shifted to the corresponding through-holes of the printed circuit boards P1 and P2. Thus, the connector terminals 20 can be all inserted into the printed circuit boards P1 and P2 without difficulty.

As mentioned above, since the first and second press-fit terminals 21*a* and 21*b* can be surely inserted into the printed circuit boards P1 and P2, the electric connector 10 enhances the electrical connection between the printed circuit boards P1 and P2, keeping a strength of the connector terminals 20 and enabling the connector terminals 20 to pass a requisite current.

Furthermore, even if the connector terminals 20 are inserted obliquely into the printed circuit boards P1 and P2, the resilient pieces 212 are further resiliently deformed to thereby prevent an excessive stress from acting on the through-holes of the printed circuit boards P1 and P2.

The connector terminal 20 is inserted into an open space formed between the wedges 321*b*, and is guided into the space R with the claws 321 being resiliently deformed. Thus, the connector terminal 20 can be set into the connector housing 30 after the completion of the connector housing 30. Hence, it is not necessary to set the connector terminal 20 in an injection die when the connector housing 30 is formed by injection molding.

Furthermore, the connector terminal 20 can be held in a fixed or non-fixed condition in the space R in accordance with both a length of the projection 33 and a space between the arms 321*a*. In addition, it is possible to determine a range in which the connector terminal 20 can swing when the connector terminal 20 is held in a non-fixed condition in the space R. Thus, the connector terminal 20 can be readily set into a fixed condition.

In the first embodiment, the buffer portion 23 is deformed in accordance with a gap between the imaginary longitudinal center lines L of the first and second press-fit terminals 21*a* and 21*b*. It should be noted that the first projecting portion 22*a* in the first embodiment is designed to be formed of a resilient metal plate having a length longer in a length-wise direction of the connector terminal 20 than a width, and hence, the resilient metal plate can be deformed when a gap between the imaginary longitudinal center lines L of the first and second press-fit terminals 21*a* and 21*b* is generated in a thickness-wise direction of the connector terminal 20. Hence, the first projecting portion 22*a* can accomplish the same performance as that of the buffer portion 23. The combination of the buffer portion 23 and the first projecting portion 22*a* provides enhanced flexibility to the connector terminal 20.

A printed circuit board to be used in an electronic device equipped in a vehicle is subject to expansion and/or contraction due to heat in a temperature range of −20 to 80 degrees centigrade. When an electric connector is soldered to a printed circuit board, a high stress acts on the solder due to expansion and contraction of the printed circuit board. The repeated stresses cause the solder to be cracked, resulting in failure in electrical connection. However, since the first and second press-fit terminals 21*a* and 21*b* can be connected to the printed circuit boards P1 and P2 merely by being inserted without being soldered to the printed circuit boards P1 and P2, it is possible to prevent the above-mentioned failure in electrical connection caused by expansion and contraction of the printed circuit board.

Second Embodiment

An electric connector in accordance with the second embodiment of the present invention is explained hereinbelow with reference to FIGS. 23 to 26. Parts or elements that correspond to those of the first embodiment have been provided with the same reference numerals, and operate in the same manner as corresponding parts or elements in the first embodiment, unless explicitly explained hereinbelow.

Figure 23:
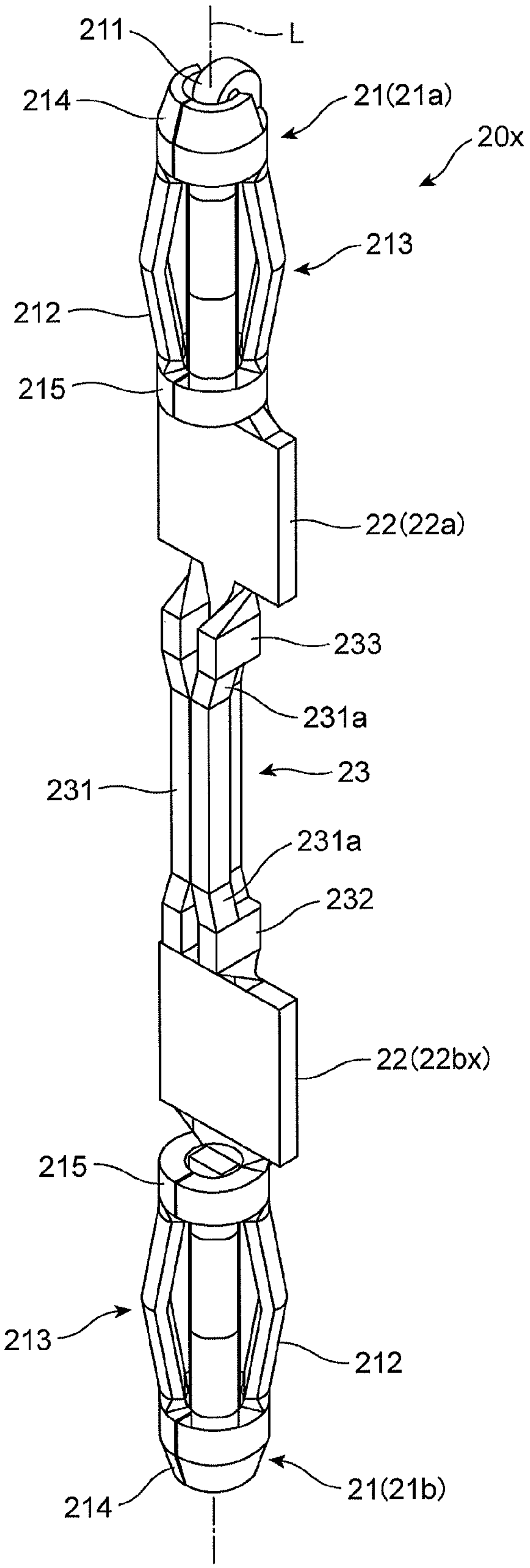
FIG. 23 is a perspective view of the connector terminal in accordance with the second embodiment of the present invention.
Figure 24:
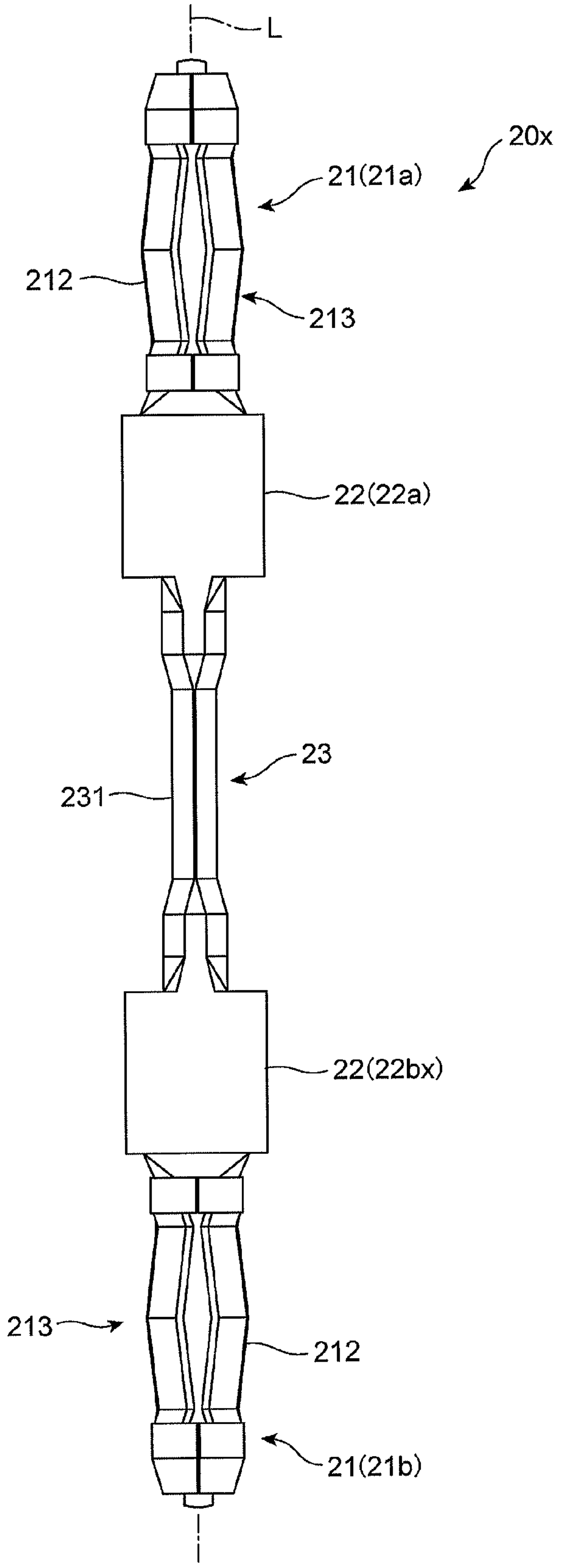
FIG. 24 is a front view of the connector terminal in accordance with the second embodiment of the present invention.
Figure 25:
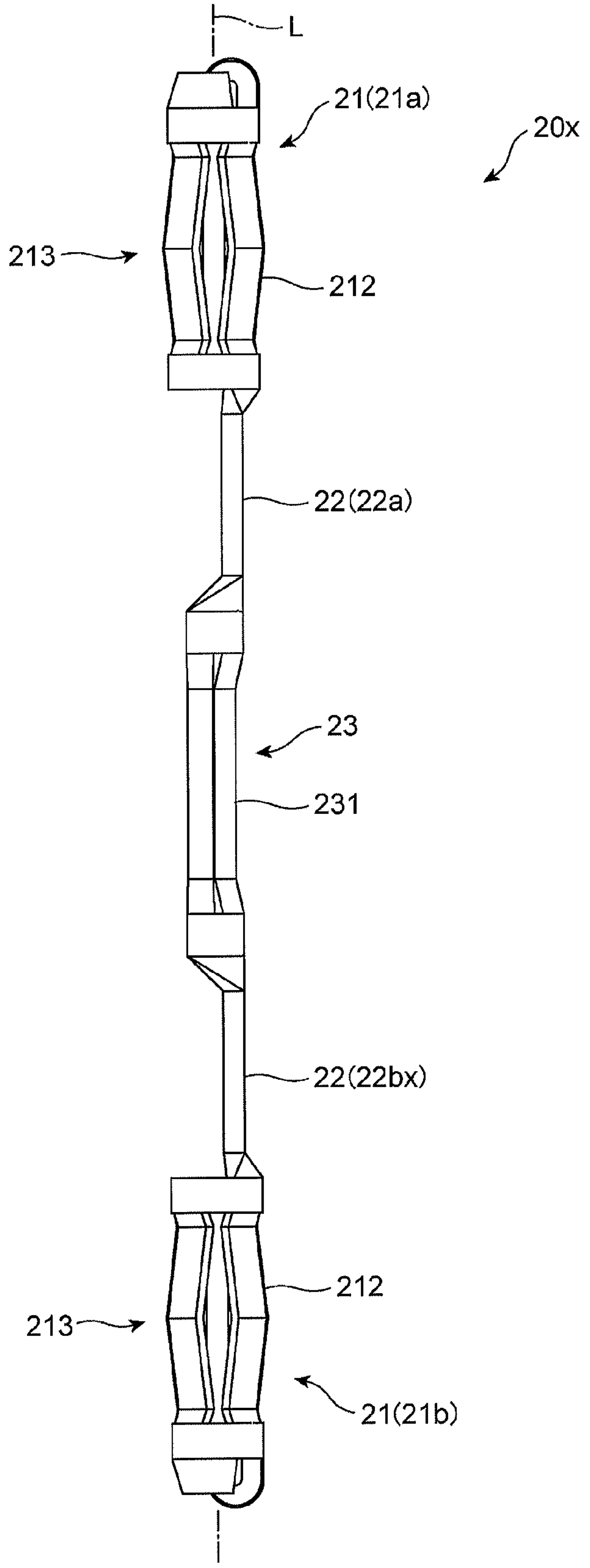
FIG. 25 is a side view of the connector terminal in accordance with the second embodiment of the present invention.
Figure 26:
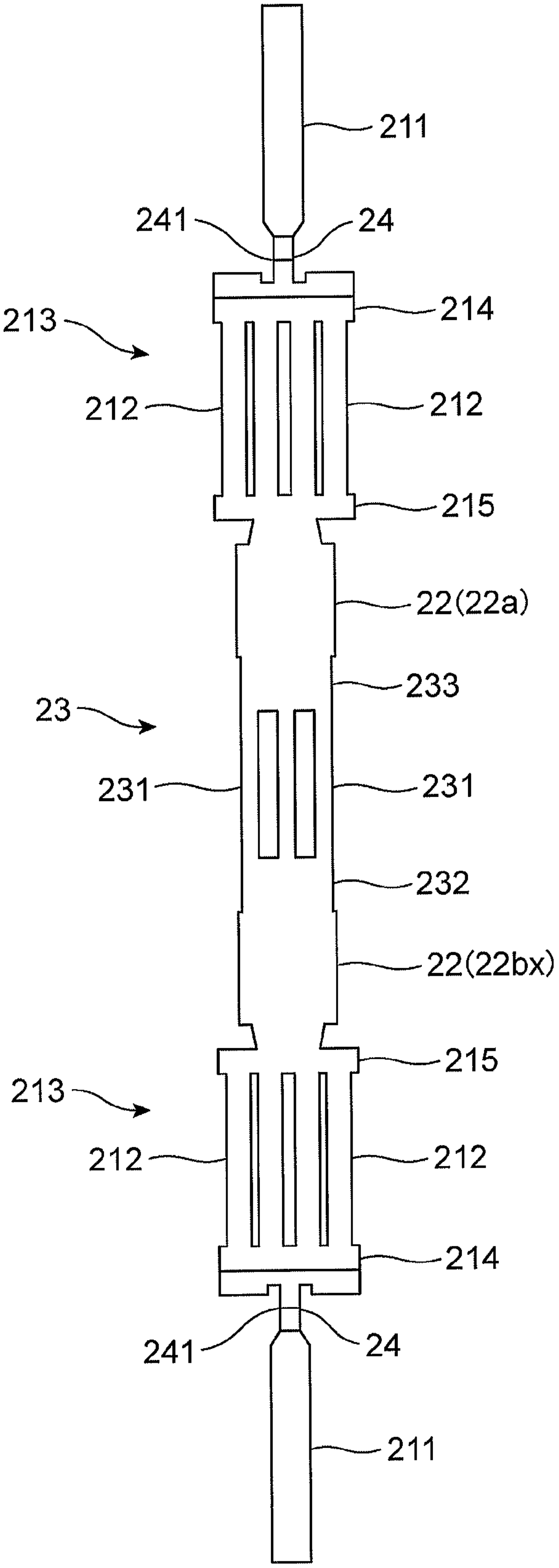
FIG. 26 is a plan view of the development of the connector terminal illustrated in FIG. 23.
Figure 27A:
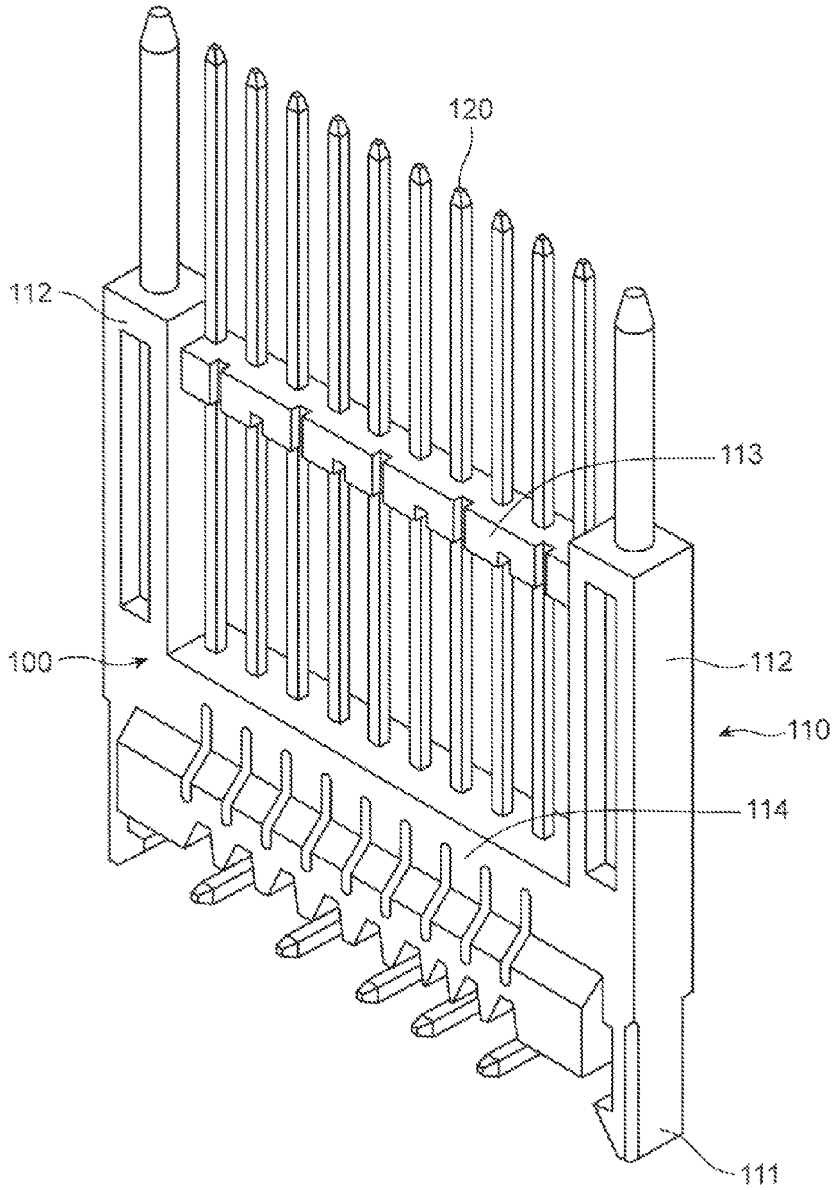
FIG. 27A Prior Art
FIG. 27A is a perspective view of the conventional connector.
Figure 27B:
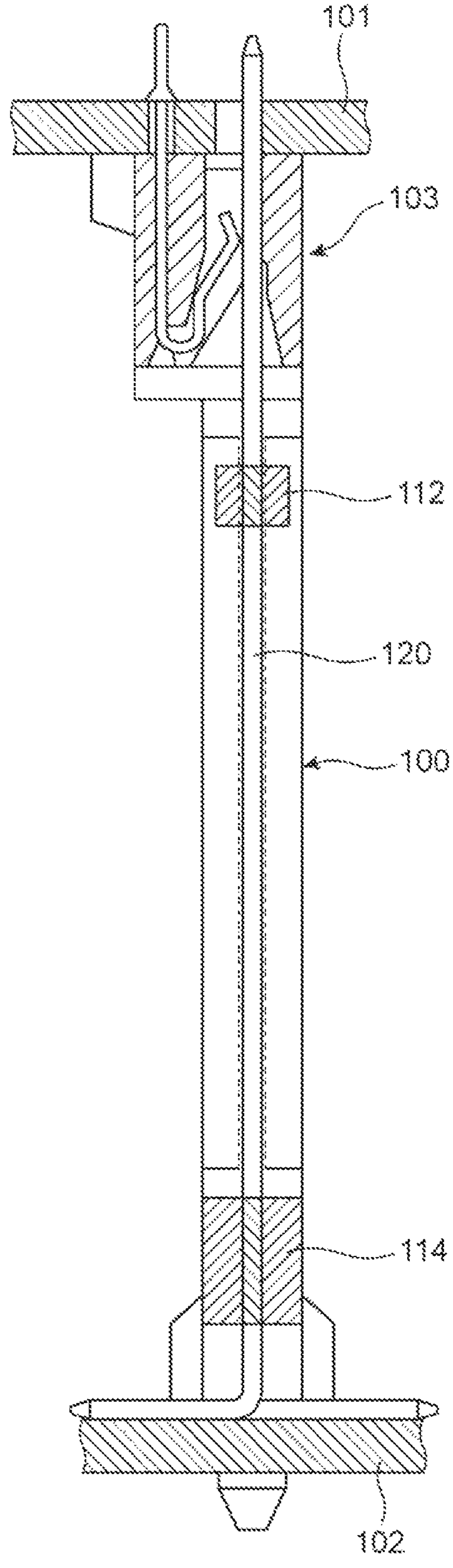
FIG. 27B Prior Art
FIG. 27B is a cross-sectional view of the conventional connector illustrated in FIG. 27A, sandwiched between two printed circuit boards.
Figure 28:
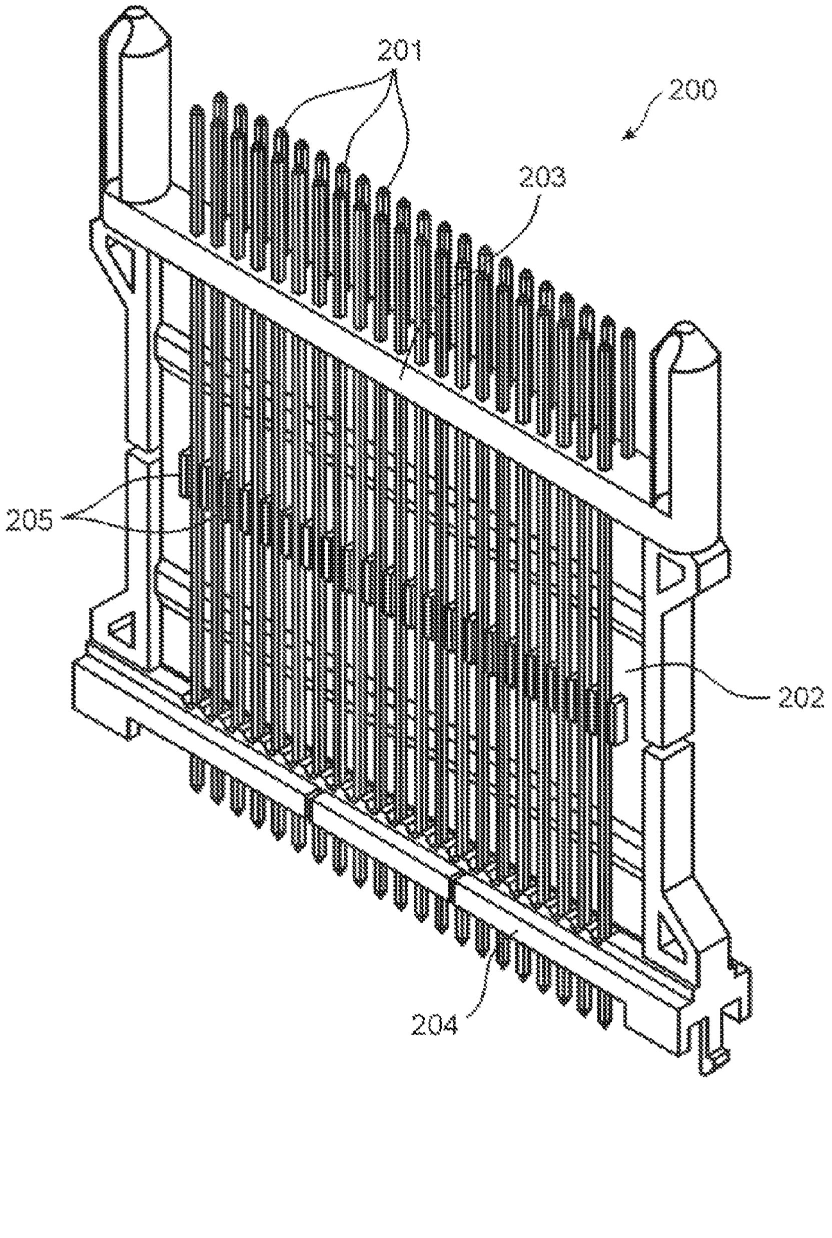
FIG. 28 Prior Art
FIG. 28 is a perspective view of the conventional pin header.

In an electric connector 20*x* in accordance with the second embodiment, a second projecting portion 22*bx* is designed to have the same size as that of a first projection portion 22*ax*, as illustrated in FIGS. 23 and 24.

The second projecting portion 22*bx* is designed to be larger than the second projection portion 22*b* in the first embodiment (see FIGS. 10 and 11), and to be formed of a thin resilient metal plate having a length longer in a length-wise direction of the connector terminal 20*x* than a width (a length measured in a width-wise direction of the connector terminal 20*x*). Thus, even if a stress acts on the connector terminal 20*x* to deform the connector terminal 20*x* in a thickness-wise direction, the thin resilient metal plate defining the second projecting portion 22*bx* can be deformed, ensuring that the second projecting portion 22*bx* is able to accomplish the same performance as that of the buffer portion 23. Accordingly, the connector terminal 20*x* in accordance with the second embodiment can be more flexible than the connector terminal 20 in accordance with the first embodiment.

INDUSTRIAL APPLICABILITY

The present invention provides the connector terminal and the connector housing both of which define the electric connector capable of electrically connecting printed circuit boards to each other by inserting the press-fit terminals formed at opposite ends of the connector terminal, into through-holes formed through the printed circuit boards. Thus, the electric connector can be employed broadly in fields such as an electric/electronic industry and a vehicle industry as a connector used for electric/electronic devices or a connector equipped in a vehicle.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2013-142065 filed on Jul. 5, 2013 including specification, claims, drawings and summary is incorporated herein by reference in its entirety.

What is claimed is:

1. A connector terminal comprising:

a pair of press-fit terminals, located at opposite ends of said connector terminal, to be inserted into through-holes formed through two printed circuit boards located facing each other, each of said press-fit terminals including a plurality of contact pieces; and at least one buffer portion deformable in accordance with a gap between imaginary longitudinal center lines of said press-fit terminals, said buffer portion including (i) a plurality of resilient pieces and (ii) a pair of binders each binding said resilient pieces at opposite ends of said resilient pieces, each of said binders bending so as to surround said imaginary longitudinal center lines therewith.

2. The connector terminal as set forth in claim 1, wherein said resilient pieces are equal in width to one another.

3. The connector terminal as set forth in claim 2, wherein said resilient pieces are collected at ends thereof in the vicinity of and in parallel with said imaginary longitudinal center lines.

4. The connector terminal as set forth in claim 1, wherein said buffer portion has a length equal to or greater than a width thereof.

5. The connector terminal as set forth in claim 1, further comprising at least one projecting portion located between said press-fit terminals, said projecting portion projecting beyond said press-fit terminals in a width-wise direction of said connector terminal.

6. A connector housing comprising a pair of holders detachably holding a plurality of connector terminals in a line, each of said connector terminals including said connector terminal defined in claim 5, wherein said holders are spaced away from each other in a length-wise direction of said connector terminals, one of said holders holds said connector terminals in a non-fixed condition, and the other holds said connector terminals in a fixed condition, and said projecting portion makes abutment in each of said holders with edges extending perpendicularly to a length-wise direction of said connector terminal.

7. The connector housing as set forth in claim 6, wherein each of said holders includes a pair of arms spaced away from each other and extending in parallel with each other, and a pair of wedges each formed at a leading edge of each of said arms, said connector terminal can be inserted into a space formed between said a s through an open space formed between said wedges, and each of said holders has a resilient force causing said arms to draw each other.

8. The connector housing as set forth in claim 7, wherein a distance between said arms in the one of said holders holding said connector terminal in a non-fixed condition is set to such a distance that at least one of said arms does not make contact with said connector terminal when said connector terminal is inserted between said arms, and a distance between said arms in the other of said holders holding said connector terminal in a fixed condition is set to such a distance that both of said arms make contact with said connector terminal when said connector terminal is inserted between said arms.

9. The connector housing as set forth in claim 8, further comprising a projection projecting towards said wedges in a space formed between said arms in each of said holders, said projection in the one of said holders holding said connector terminal in a non-fixed condition has such a length that said projection does not make contact with said connector terminal when said connector terminal is inserted between said arms, and said projection in the other of said holders holding said connector terminal in a fixed condition has such a length that said projection makes contact with said connector terminal when said connector terminal is inserted between said arms.

10. The connector terminal as set forth in claim 5, wherein said projecting portion is formed of a thin resilient metal plate.

11. The connector terminal as set forth in claim 1, further comprising two projecting portions located between said press-fit terminals, each of said projecting portions projecting beyond said press-fit terminals in a width-wise direction of said connector terminal, one of said projecting portions having a length greater than the same of the other of said projecting portions in a length-wise direction of said connector terminal.

12. A connector housing comprising a pair of holders detachably holding a plurality of connector terminals in a line, each of said connector terminals including said connector terminal defined in claim 1, wherein said holders are spaced away from each other in a length-wise direction of said connector terminals, and one of said holders holds said connector terminals in a non-fixed condition, and the other holds said connector terminals in a fixed condition.

13. The connector housing as set forth in claim 12, wherein each of said holders includes a pair of arms spaced away from each other and extending in parallel with each other, and a pair of wedges each formed at a leading edge of each of said arms, said connector terminal can be inserted into a space formed between said arms through an open space formed between said wedges, and each of said holders has a resilient force causing said arms to draw each other.

14. The connector housing as set forth in claim 13, wherein a distance between said arms in the one of said holders holding said connector terminal in a non-fixed condition is set to such a distance that at least one of said arms does not make contact with said connector terminal when said connector terminal is inserted between said arms, and a distance between said arms in the other of said holders holding said connector terminal in a fixed condition is set to such a distance that both of said arms make contact with said connector terminal when said connector terminal is inserted between said arms.

15. The connector housing as set forth in claim 14, further comprising a projection projecting towards said wedges in a space formed between said arms in each of said holders, said projection in the one of said holders holding said terminal connector in a non-fixed condition has such a length that said projection does not make contact with said connector terminal when said connector terminal is inserted between said arms, and said projection in the other of said holders holding said terminal connector in a fixed condition has such a length that said projection makes contact with said connector terminal when said connector terminal is inserted between said arms.

16. The connector terminal as set forth in claim 1, wherein said buffer portion is formed of a thin resilient metal plate.

* * * * *